(12) United States Patent
Ma et al.

(10) Patent No.: US 11,087,987 B2
(45) Date of Patent: Aug. 10, 2021

(54) SEMICONDUCTOR DEVICE AND METHOD

(71) Applicant: Taiwan Semiconductor Manufacturing Company, Ltd., Hsinchu (TW)

(72) Inventors: Ta-Chun Ma, New Taipei (TW); Yi-Cheng Li, Yunlin County (TW); Pin-Ju Liang, Changhua County (TW); Cheng-Po Chau, Tainan (TW); Jung-Jen Chen, Hsinchu (TW); Pei-Ren Jeng, Chu-Bei (TW); Chii-Horng Li, Zhubei (TW); Kei-Wei Chen, Tainan (TW); Cheng-Hsiung Yen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 38 days.

(21) Appl. No.: 16/458,783

(22) Filed: Jul. 1, 2019

(65) Prior Publication Data
US 2020/0135467 A1    Apr. 30, 2020

Related U.S. Application Data

(60) Provisional application No. 62/753,403, filed on Oct. 31, 2018.

(51) Int. Cl.
*H01L 21/223* (2006.01)
*H01L 29/66* (2006.01)
(Continued)

(52) U.S. Cl.
CPC ...... *H01L 21/223* (2013.01); *H01L 21/31105* (2013.01); *H01L 21/324* (2013.01); *H01L 21/823814* (2013.01); *H01L 21/823821* (2013.01); *H01L 27/0924* (2013.01); *H01L 29/66795* (2013.01); *H01L 29/785* (2013.01);
(Continued)

(58) Field of Classification Search
CPC ............. H01L 21/223; H01L 21/31105; H01L 21/324; H01L 21/823814; H01L 21/823821; H01L 21/76224; H01L 29/66795; H01L 29/7833; H01L 29/785
See application file for complete search history.

(56) References Cited

U.S. PATENT DOCUMENTS 8,497,177 B1 *   7/2013   Chang ............... H01L 29/66795
                                                    438/283
9,093,530 B2     7/2015   Huang et al.
(Continued)

*Primary Examiner* — Sue A Purvis
*Assistant Examiner* — Scott Stowe
(74) *Attorney, Agent, or Firm* — Slater Matsil, LLP

(57) ABSTRACT

In an embodiment, a method includes: forming a first fin extending from a substrate, the substrate including silicon, the first fin including silicon germanium; forming an isolation region around the first fin, an oxide layer being formed on the first fin during formation of the isolation region; removing the oxide layer from the first fin with a hydrogen-based etching process, silicon at a surface of the first fin being terminated with hydrogen after the hydrogen-based etching process; desorbing the hydrogen from the silicon at the surface of the first fin to depassivate the silicon; and exchanging the depassivated silicon at the surface of the first fin with germanium at a subsurface of the first fin.

20 Claims, 27 Drawing Sheets

(51) Int. Cl.
*H01L 21/311* (2006.01)
*H01L 21/324* (2006.01)
*H01L 21/8238* (2006.01)
*H01L 29/78* (2006.01)
*H01L 27/092* (2006.01)
*H01L 21/762* (2006.01)

(52) U.S. Cl.
CPC .... *H01L 29/7833* (2013.01); *H01L 21/76224* (2013.01)

(56) References Cited

U.S. PATENT DOCUMENTS

| | | |
|---|---|---|
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |
| 2014/0170839 A1* | 6/2014 | Brunco ............... H01L 29/1054 438/479 |
| 2018/0337098 A1* | 11/2018 | Ando ............... H01L 29/66795 |

* cited by examiner

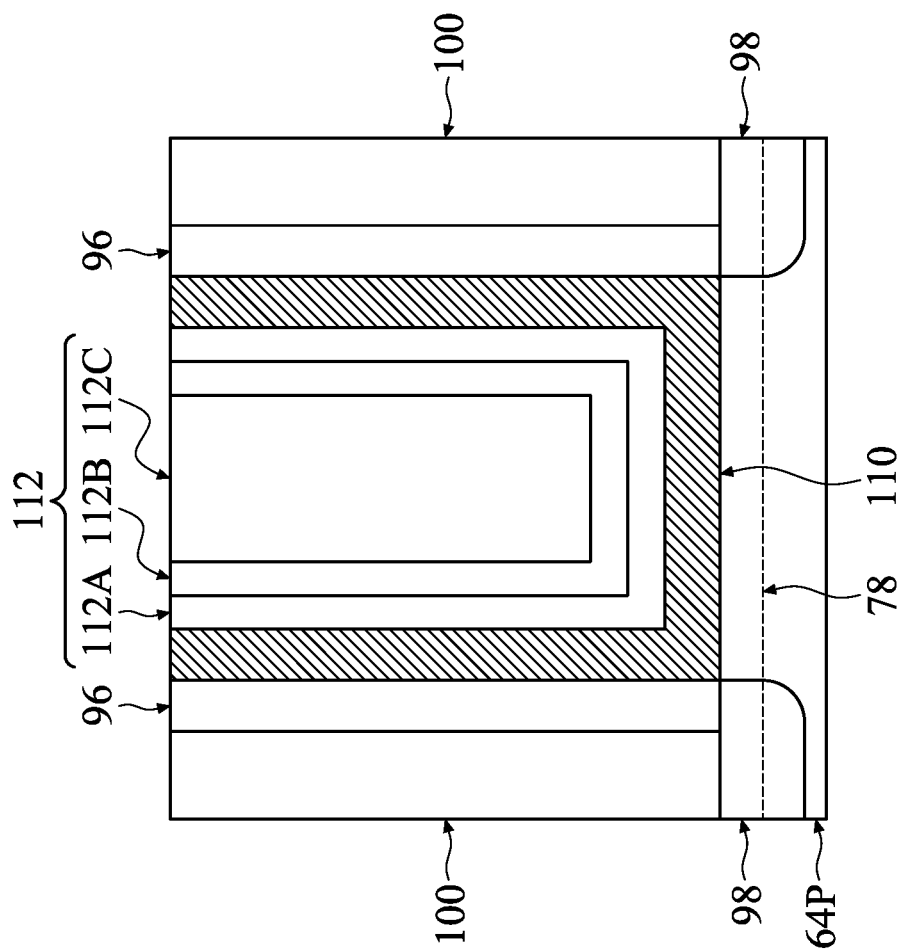

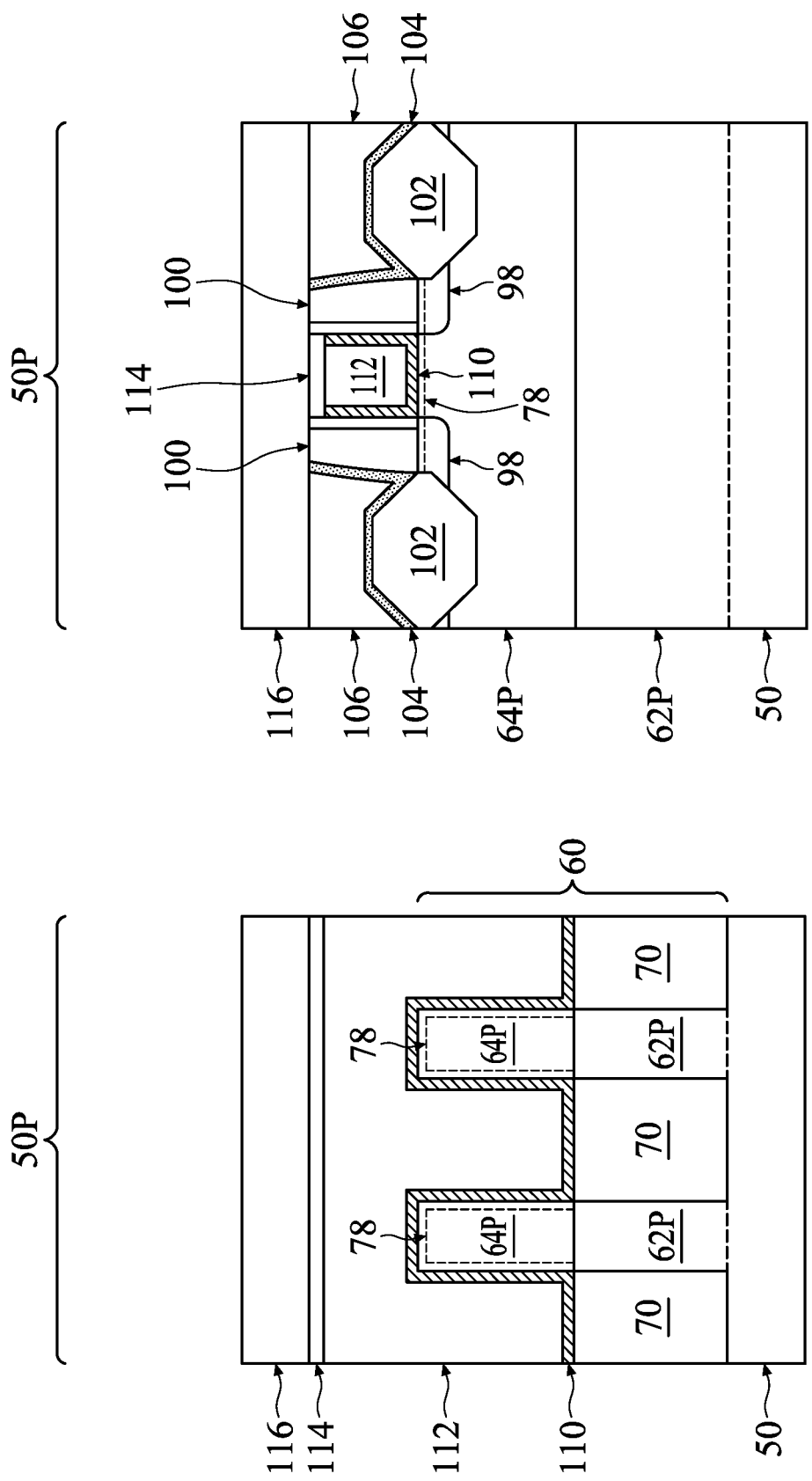

US 11,087,987 B2

SEMICONDUCTOR DEVICE AND METHOD

PRIORITY CLAIM AND CROSS-REFERENCE

This application claims the benefit of U.S. Provisional Application No. 62/753,403, filed on Oct. 31, 2018, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8, 9, 11, 12A, 12B, 13A, 13B, 14A, 14B, 14C, 14D, 15A, 15B, 16A, 16B, 17A, 17B, 18A, 18B, 18C, 19A, 19B, 20A, and 20B are cross-sectional views of intermediate stages in the manufacturing of FinFETs, in accordance with some embodiments.

DETAILED DESCRIPTION

Figure 1:
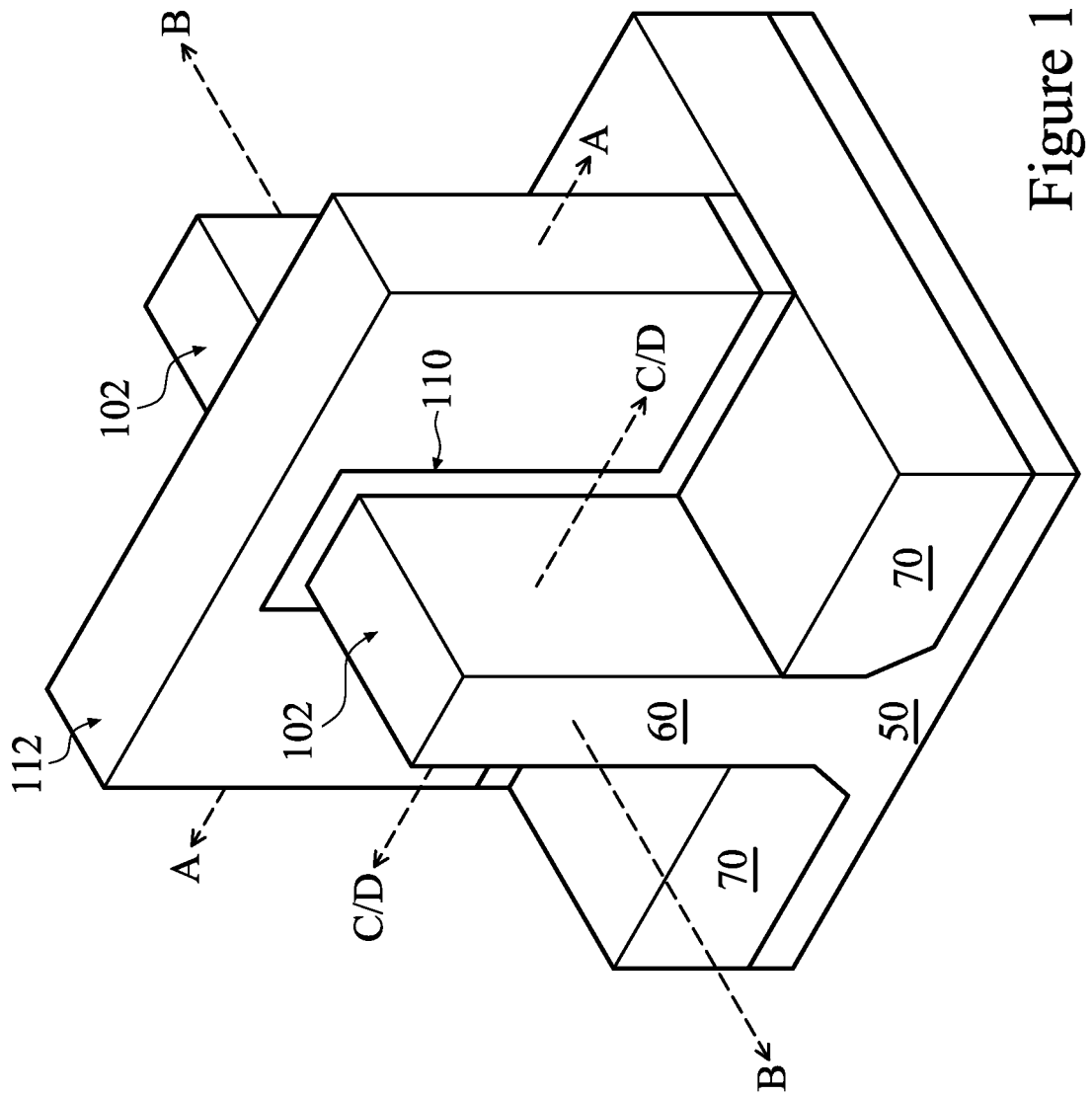
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to some embodiments, a substrate of a first semiconductor material (e.g., silicon) is provided, and a layer of a second semiconductor material (e.g., silicon germanium) is formed on the substrate. The second semiconductor material may have a low germanium concentration. Trenches are etched in the semiconductor material layers to form fins, and an isolation material is formed between the fins. During formation of the isolation material is formed, hydrogen is bonded to silicon atoms at the surfaces of the fins. A germanium condensation process is performed to condense germanium atoms along the sidewalls of the fins. During the germanium condensation process, a hydrogen desorption process is used to break the hydrogen bonds and outgas the hydrogen from the fins. Once the hydrogen is outgassed, the silicon atoms at the surface of the fins are replaced with germanium atoms from the sub-surface of the fins. By condensing the germanium atoms along the sidewalls of the fins, the germanium concentration in the channel regions of resulting FinFET devices may be increased. Because the fins are initially formed with a low germanium concentration, they have a lower amount of compressive strain, and thus deformation of the fins during trench etching may be reduced.

FIG. 1 illustrates an example of a FinFET in a three-dimensional view, in accordance with some embodiments. The FinFET comprises a fin 60 extending from a substrate 50 (e.g., a semiconductor substrate). Isolation regions 70 are disposed over the substrate 50, and the fin 60 protrudes above and from between neighboring isolation regions 70. Although the isolation regions 70 are described/illustrated as being separate from the substrate 50, as used herein the term "substrate" may be used to refer to just the semiconductor substrate or a semiconductor substrate inclusive of isolation regions. Additionally, although the fin 60 is illustrated as a single, continuous material as the substrate 50, the fin 60 and/or the substrate 50 may comprise a single material or a plurality of materials. In this context, the fin 60 refers to the portion extending between the neighboring isolation regions 70.

A gate dielectric layer 110 is along sidewalls and over a top surface of the fin 60, and a gate electrode 112 is over the gate dielectric layer 110. Source/drain regions 102 are disposed in opposite sides of the fin 60 with respect to the gate dielectric layer 110 and gate electrode 112. FIG. 1 further illustrates reference cross-sections that are used in later figures. Cross-section A-A is along a longitudinal axis of the gate electrode 112 and in a direction, for example, perpendicular to the direction of current flow between the source/drain regions 102 of the FinFET. Cross-section B-B is perpendicular to cross-section A-A and is along a longitudinal axis of the fin 60 and in a direction of, for example, a current flow between the source/drain regions 102 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 20B are cross-sectional views of intermediate stages in the manufacturing of FinFETs, in accordance with some embodiments. FIGS. 2, 3, 4, 5, 6, 7, 8, 9, and 11 illustrate reference cross-section A-A illustrated in FIG. 1, except for multiple fins/FinFETs. FIGS. 12A, 13A, 14A, 15A, 16A, 17A, 18A, 19A, and 20A are illustrated along reference cross-section A-A illustrated in FIG. 1, and FIGS. 12B, 13B, 14B, 15B, 16B, 17B, 18B, 19B, and 20B are illustrated along a similar cross-section B-B illustrated in FIG. 1, except for multiple fins/FinFETs. FIGS. 14C and 14D are illustrated along reference cross-section C/D-C/D illustrated in FIG. 1, except for multiple fins/FinFETs.

Figure 2:
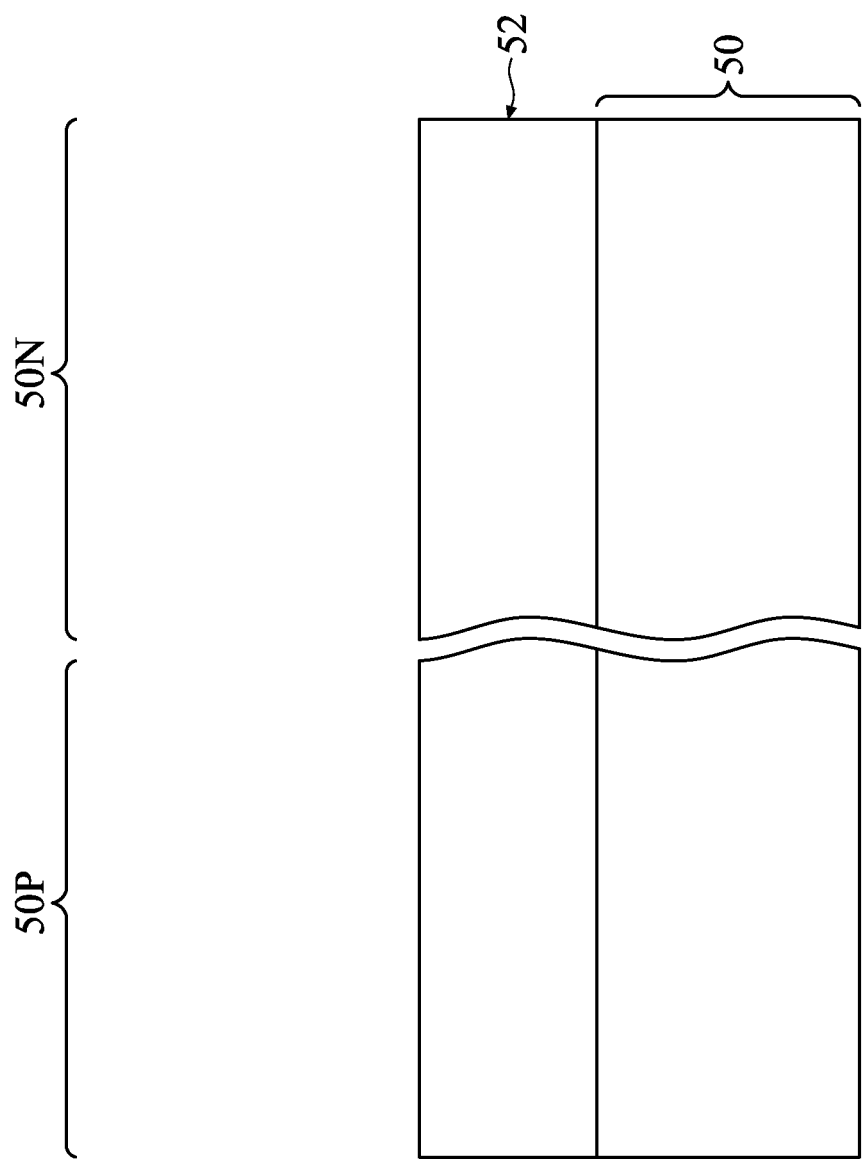

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P (as illustrated by a divider), and any number of device features (e.g., other active devices, doped regions, isolation structures, etc.) may be disposed between the region 50N and the region 50P.

Appropriate wells (not shown) may be formed in the substrate 50. In the embodiment shown, a p-type well is formed in the region 50N, and a n-type well is formed in the region 50P. The wells are formed by implanting the region 50N and the region 50P with p-type and/or n-type impurities. After the implants of the region 50N and region 50P, an anneal may be performed to activate the p-type and/or n-type impurities that were implanted.

In embodiments with different well types, different implant steps for the region 50N and the region 50P may be achieved using a photoresist or other masks (not shown). For example, a photoresist may be formed over the region 50N of the substrate 50. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, antimony, or the like implanted in the region to a concentration of equal to or less than $10^{18}$ cm$^{-3}$, such as between about $10^{17}$ cm$^{-3}$ and about $10^{18}$ cm$^{-3}$. After the implant, the photoresist is removed, such as by an acceptable ashing process.

Following the implanting of the region 50P, a photoresist is formed over the region 50P of the substrate 50. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, BF$_2$, indium, or the like implanted in the region to a concentration of equal to or less than $10^{18}$ cm$^{-3}$, such as between about $10^{17}$ cm$^{-3}$ and about $10^{18}$ cm$^{-3}$. After the implant, the photoresist may be removed, such as by an acceptable ashing process.

A first semiconductor region 52 is formed over the substrate 50. The first semiconductor region 52 is a semiconductor material, such as silicon, silicon carbide, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like. In an embodiment, the first semiconductor region 52 is silicon. The first semiconductor region 52 is epitaxially grown on the substrate 50. As discussed further below, the first semiconductor region 52 will be patterned to form fins in the region 50N.

Figure 3:
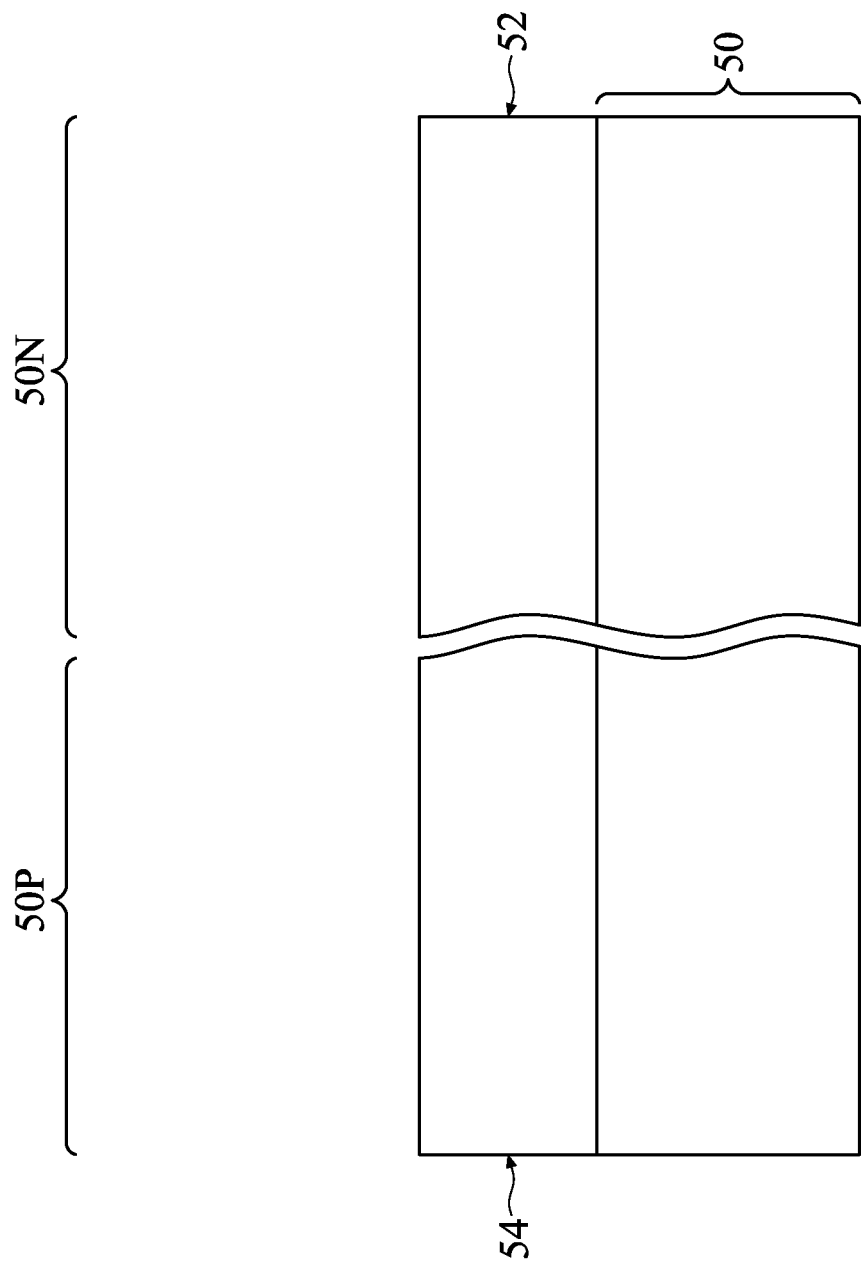

In FIG. 3, a second semiconductor region 54 is formed over the substrate 50. The second semiconductor region 54 is a semiconductor material, such as silicon germanium (e.g., Si$_x$Ge$_{1-x}$, where x can be in the range of 0 to 1), pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like. In an embodiment, the second semiconductor region 54 is silicon germanium. The second semiconductor region 54 is epitaxially grown on the substrate 50. As an example of forming the second semiconductor region 54, an opening may be formed in the first semiconductor region 52 over the region 50P of the substrate. The opening may be formed by one or more etching process(es), using a photoresist as an etching mask. The etching process(es) may include a wet etch, a dry etch, a reactive ion etch (RIE), a neutral beam etch (NBE), a combination thereof, or the like, and may be anisotropic. The second semiconductor region is then epitaxially grown in the opening, on the substrate 50. The second semiconductor region 54 may be formed with a low germanium concentration, which may provide enough strain to boost mobility without generating dislocation defects when the thickness of the second semiconductor region 54 reaches a desired channel height. It should be appreciated that the target low germanium concentration may change based on the fin design and desired parameters of the final device.

Silicon and silicon germanium have different lattice constants. As such, the second semiconductor region 54 and substrate 50 have mismatched lattice constants. The lattice constant mismatch depends on the germanium concentration of the second semiconductor region 54, where a higher germanium concentration results in a greater lattice constant mismatch. The lattice constant mismatch induces a compressive strain in the second semiconductor region 54, which may increase the carrier mobility of the second semiconductor region 54, which may improve the channel region mobility of subsequently formed p-type devices. Because the germanium concentration of the second semiconductor region 54 is low, the lattice constant mismatch and amount of compressive strain is also low.

In some embodiments, the first semiconductor region 52 and second semiconductor region 54 are in situ doped during growth to have appropriate doped regions (e.g., wells). The doped regions of the first semiconductor region 52 and second semiconductor region 54 may be of the same doping type as the underlying doped regions of the substrate 50. The doped regions of the first semiconductor region 52 and second semiconductor region 54 may have the same doping concentration as the underlying doped regions of the substrate 50, or may have different doping concentrations. In some embodiments, the doping of the first semiconductor region 52 and second semiconductor region 54 may obviate the implantations in the substrate 50, although in situ and implantation doping may be used together.

Figure 4:
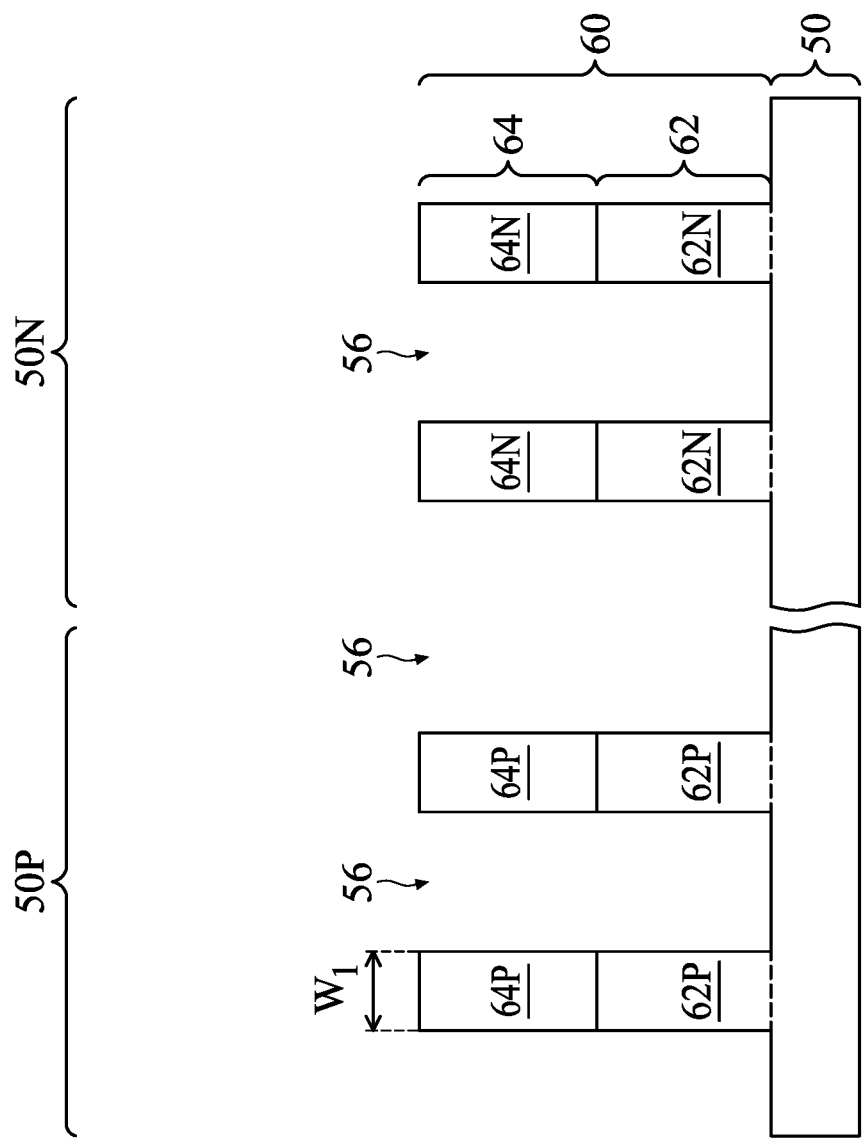

In FIG. 4, trenches 56 are formed in the first semiconductor region 52 and second semiconductor region 54 (and optionally the substrate 50). The trenches 56 may be formed by one or more etching process(es), using a photoresist as an etching mask. The etching process(es) may include a wet etch, a dry etch, a reactive ion etch (RIE), a neutral beam etch (NBE), a combination thereof, or the like, and may be anisotropic. The trenches 56 may extend partially into the first semiconductor region 52 and second semiconductor region 54, or may extend through the semiconductor regions and into the substrate 50. Portions of the first semiconductor region 52 and second semiconductor region 54 (and optionally the substrate 50) remaining between the trenches 56 are referred to as fins 60. The fins 60 each include a lower portion 62 and a upper portion 64. The lower portions 62 include lower portions 62N and 62P, with the lower portions 62N comprising remaining portions of the region 50N of the substrate 50, and the lower portions 62P comprising remaining portions of the region 50P of the substrate 50. The upper portions 64 include upper portions 64N and 64P, with the upper portions 64N comprising remaining portions of the first semiconductor region 52, and the upper portions 64P comprising remaining portions of the second semiconductor region 54. The fins 60 are formed to a first width $W_1$. In some embodiments, the first width $W_1$ is in the range of about 3 nm to about 15 nm. Such a fin width may allow the fin to retain a sufficient thickness after subsequent etching process(es) (described below).

The fins 60 are semiconductor strips. When the second semiconductor region 54 is etched to form the upper portions 64P of the fins 60, sidewalls of the fins 60 are exposed and have no lateral constraints, e.g., are exposed to free space and are not supported by other structures or materials. As noted above, the second semiconductor region 54 is strained. Because sidewalls of the fins 60 are unconstrained during the etching, the strain in the second semiconductor region 54 is released during the etching. The shape of the semiconductor material may change when the strain is released, deforming the fins 60 in the region 50P such that they do not have a desired fin shape. In particular, the fins 60 may deform such that the semiconductor strips are not straight strips in a top-down view. The deformed fins 60 may bend or curve as they extend along the substrate 50. The amount of deformity of the fins 60 depends on the amount of strain released from the second semiconductor region 54. The risk of fin deformity may be exacerbated when the fins 60 are formed with narrower widths or greater heights. Excessive deformation may decrease the yield of the fins 60, and may also decrease the carrier mobility of the fins 60. As noted above, the second semiconductor region 54 is formed with a low initial germanium concentration. Because the second semiconductor region 54 is formed with a low initial germanium concentration, the amount of strain released is low. By forming the second semiconductor region 54 with a low initial germanium concentration, the carrier mobility gained by avoiding fin deformation may be greater than the carrier mobility lost by reducing germanium concentration. Further, the line-edge roughness of the fins 60 in the region 50P may be improved when the second semiconductor region 54 is formed with a low initial germanium concentration.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 5:
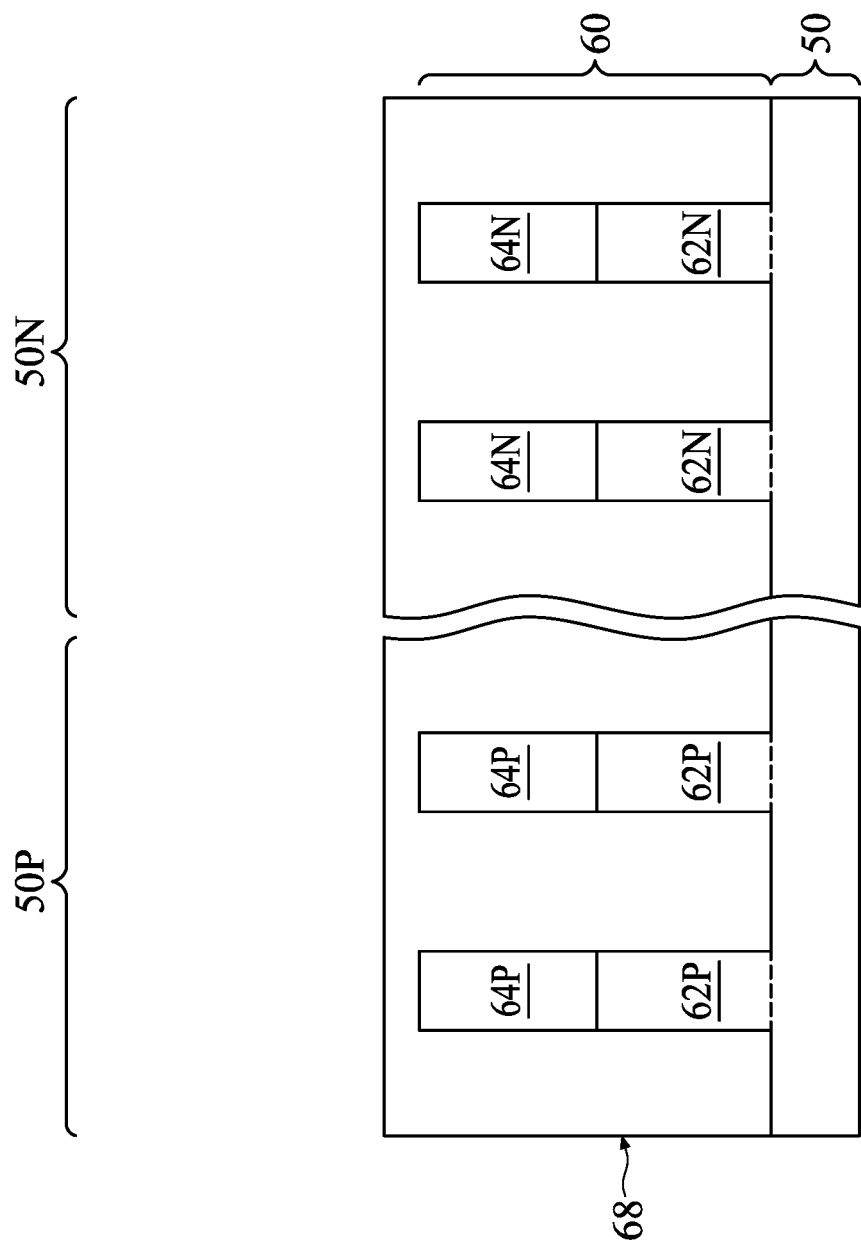

In FIG. 5, an insulation material 68 is formed over the substrate 50 and between neighboring fins 60. The insulation material 68 may be formed such that excess portions of the insulation material 68 covers the fins 60. The insulation material 68 may be an oxide, such as silicon oxide, a nitride, the like, or a combination thereof, and may be formed by a high density plasma chemical vapor deposition (HDP-CVD), a flowable chemical vapor deposition (FCVD) (e.g., a chemical vapor deposition (CVD) based material deposition in a remote plasma system and post curing to make it convert to another material, such as an oxide), the like, or a combination thereof. Other insulation materials formed by any acceptable process may be used. In the illustrated embodiment, the insulation material 68 is silicon oxide formed by a FCVD process. An anneal process may be performed once the insulation material is formed. Although the insulation material 68 is illustrated as a single layer, some embodiments may utilize multiple layers. For example, in some embodiments a liner (not shown) may first be formed along a surface of the substrate 50 and the fins 60. Thereafter, a fill material, such as those discussed above may be formed over the liner.

Figure 6:
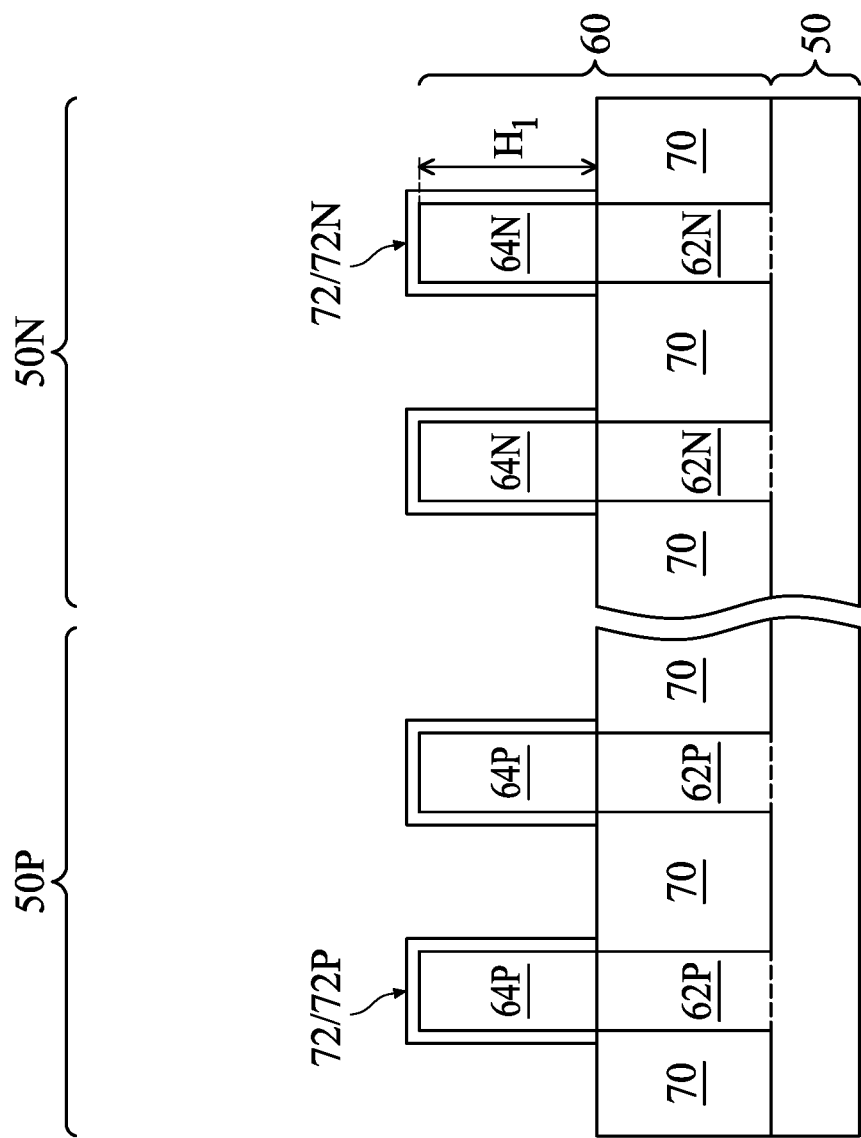

In FIG. 6, the insulation material 68 is recessed to form shallow trench isolation (STI) regions 70. The insulation material 68 is recessed such that the upper portions 64 of the fins 60 protrude from between neighboring STI regions 70. The insulation material 68 may be recessed by performing a planarization process followed by an acceptable etching process. In some embodiments, the planarization process includes a chemical mechanical polish (CMP), an etch back process, combinations thereof, or the like. The planarization process exposes the fins 60. Top surfaces of the fins 60 and the insulation material 68 are level after the planarization process. The STI regions 70 may then be recessed using an acceptable etching process, such as one that is selective to the material of the insulation material 68. For example, a chemical oxide removal using a hydrogen source (e.g., ammonia) with a fluorine source (e.g., nitrogen trifluoride), or a chemical oxide removal using dilute hydrofluoric (dHF) acid may be used. The top surfaces of the STI regions 70 may be formed flat, convex, and/or concave by the etching process. The exposed portions of the fins 60 have a first height $H_1$. In some embodiments, the first height $H_1$ is in the range of about 30 nm to about 70 nm.

In the embodiment shown, top surfaces of the STI regions 70 are level with top surfaces of the lower portions 62 of the fins 60, such that the upper portions 64 of the fins 60 are completely exposed. In other embodiments, the top surfaces of the STI regions 70 are disposed above top surfaces of the lower portions 62 of the fins 60, such that the upper portions 64 of the fins 60 are partially exposed. In yet other embodiments, top surfaces of the STI regions 70 are disposed below top surfaces of the lower portions 62 of the fins 60, such that the upper portions 64 of the fins 60 are completely exposed and the lower portions 62 of the fins 60 are partially exposed.

During the process for forming the STI regions 70, oxide layers 72 are formed on exposed portions of the fins 60. The oxide layers 72 on the fins 60 may be, e.g., a native oxide that is formed when the insulation material 68 is formed, planarized, and/or etched. The oxide layers 72 include oxide layers 72N on the upper portions 64N of the fins 60, and further include oxide layers 72P on the upper portions 64P of the fins 60. The formation rate of the oxide layers 72P on the fins 60 in the region 50P may be affected by the germanium concentration of the upper portions 64P of the fins 60. In particular, fins 60 with a greater germanium concentration may oxidize quicker, and so the upper portions 64P of the fins 60 may oxidize quicker than the upper portions 64N of the fins 60. The oxide layers 72P may thus be thicker than the oxide layers 72N. Because the second semiconductor region 54 is formed with a low initial germanium concentration, loading effects may be avoided during the oxidation.

Figure 7:
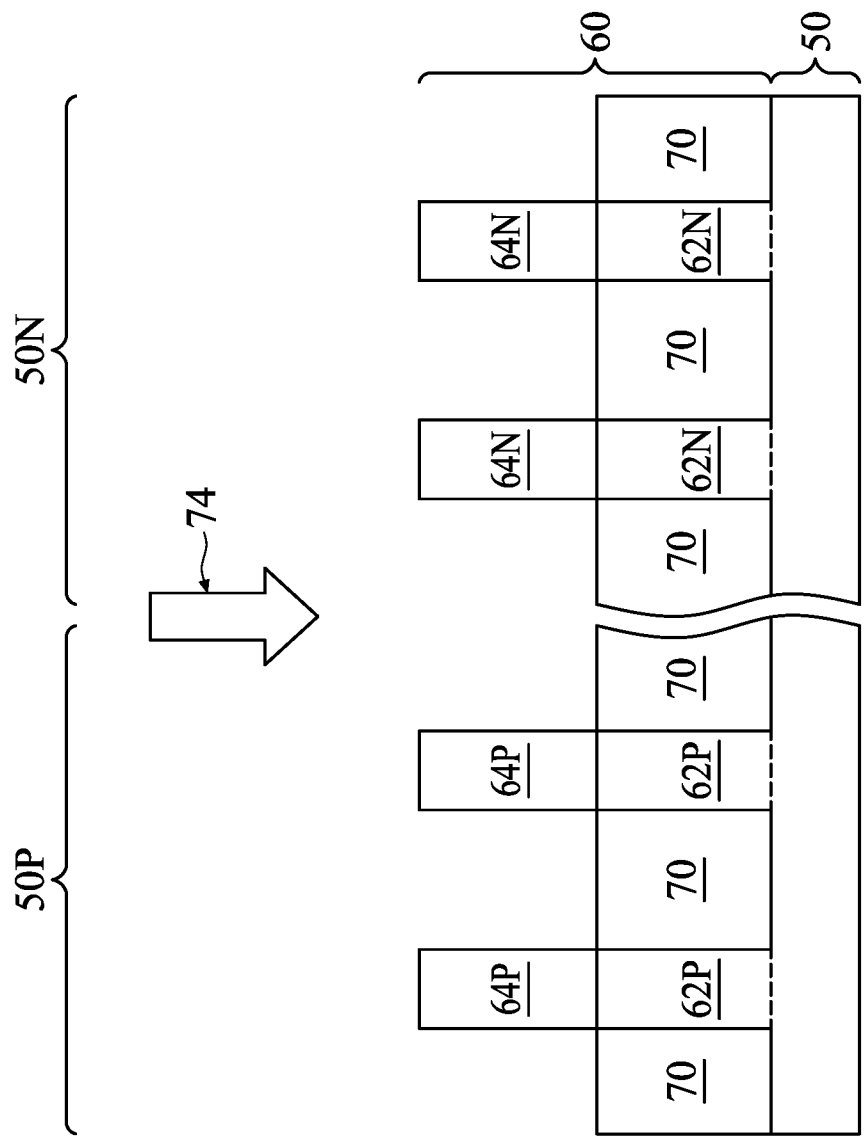

In FIG. 7, an oxide removal process 74 is performed to remove the oxide layers 72 from the fins 60. The oxide removal process 74 may be performed with one or more etching process(es). The etching process(es) may include a wet etch, a dry etch, a combination thereof, or the like. A dry etch may be performed with etchants including $CHF_3$, $CF_4$, combinations thereof, or the like. A wet etch may be performed with etchants including hot or cold dHF acid, Sulfuric Peroxide Mixture (SPM) (e.g., a mixture of $H_2SO_4$ and $H_2O_2$), Ammonia Peroxide Mixture (APM) (e.g., a mixture of $NH_4OH$, $H_2O_2$, and $H_2O$), combinations thereof, or the like. The etch may be isotropic or anisotropic. During the etching process(es), widths of the exposed portions of the fins 60 may be reduced. The etchants used in the etching process(es) contain hydrogen. As such, the oxide removal process 74 may be referred to as a hydrogen-based etching. After the etching process(es) are completed, bonds at the surfaces of the fins 60 are terminated by free hydrogen atoms from the etchants. In particular, the hydrogen atoms bond to silicon atoms at the first monolayer of the fins 60.

Figure 8:
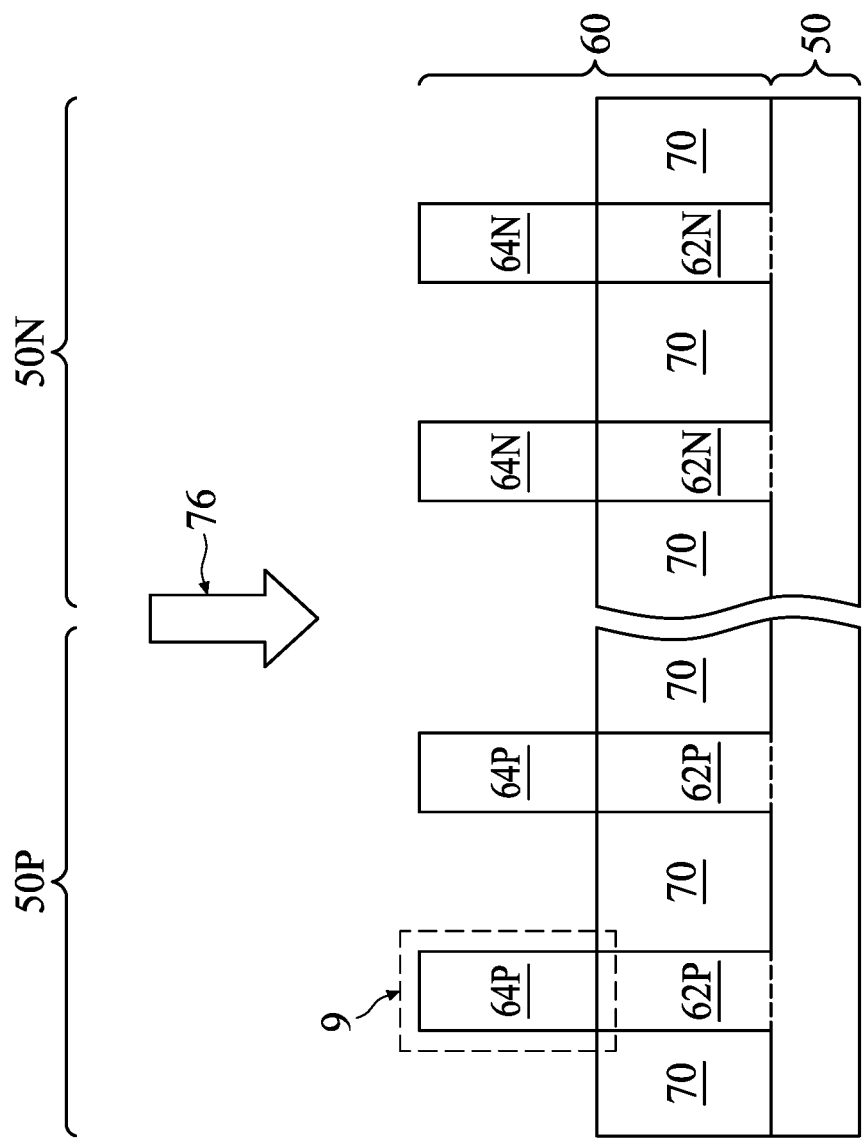
Figure 9:
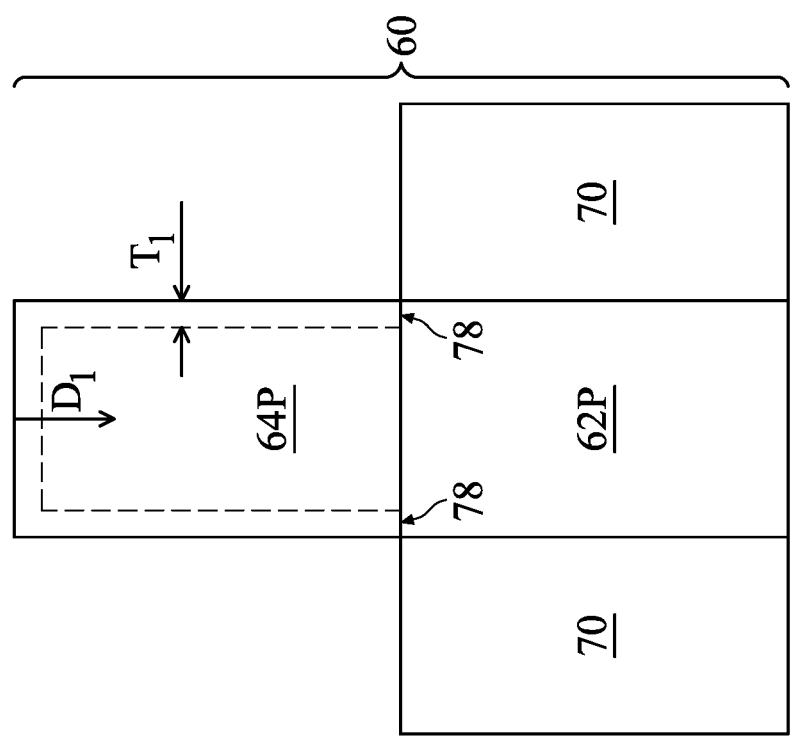

In FIG. 8, a germanium condensation process 76 is performed on the fins 60. FIG. 9 is a detailed view of a region 9 in FIG. 8, showing additional features of a fin 60 after the germanium condensation process 76. FIGS. 8 and 9 will be described together.

The germanium condensation process 76 forms a germanium-rich layer 78 in the upper portion 64P of each fin 60 in the region 50P. The resulting germanium-rich layers 78 are in sidewalls of the upper portions 64P of the fins 60. As such, edge portions of the upper portions 64P of the fins 60 have a higher germanium concentration than center portions of the upper portions 64P of the fins 60. The edge portions include sides and top surfaces of the upper portions 64P of the fins 60. The germanium-rich layers 78 will be the channel regions of resulting p-type FinFETs in the region 50P. Although the second semiconductor region 54 was formed with a low initial germanium concentration, the germanium-rich layers 78 have a high germanium concentration. For example, the germanium concentration of the germanium-rich layers 78 may be from about 1 atomic percent (at. %) to about 10 at. % (such as about 7 at. %) greater than the initial germanium concentration of the second semiconductor region 54. Forming the germanium-rich layers 78 may reduce the work function at the edge portions of the fins 60, thus improving the carrier mobility of the resulting FinFETs and increasing $I_{ON}$ for the resulting FinFETs. As explained further below, the germanium condensation process 76 does not form germanium-rich layers on the upper portion 64N of each fin 60 in the region 50N. Masking of the region 50N during the germanium condensation process 76 may thus be avoided, reducing processing costs.

The germanium condensation process 76 includes hydrogen desorption and germanium segregation aspects, which may be accomplished together by a thermal treatment process. As explained above, silicon atoms at the surfaces of the fins 60 bond with trace hydrogen atoms from the hydrogen-based oxide removal process 74 (see FIG. 7). During hydrogen desorption, the bonds between the hydrogen atoms and surface silicon atoms are broken and the hydrogen atoms are removed. During germanium segregation, silicon atoms at the surface of the upper portions 64P of the fins 60 exchanges places with germanium atoms at the subsurface of the upper portions 64P of the fins 60, so that germanium is segregated to the surfaces of the fins 60 in the region 50P. Hydrogen-terminated silicon atoms do not readily exchange places with germanium atoms in the crystalline structure of the fins 60. By breaking the bonds between the hydrogen atoms and surface silicon atoms, the germanium segregation process may be more easily performed.

The hydrogen desorption is accomplished by adding sufficient energy to bring the upper portions 64 of the fins 60 to sorption equilibrium. The bonds between the hydrogen atoms and surface silicon atoms are broken such that the surface silicon atoms are depassivated. During the process, the fins 60 are exposed to a hydrogen-starved environment. The hydrogen atoms are thus outgassed into the environment instead of recombining with other surface silicon atoms. The outgassed hydrogen atoms may then be removed.

The germanium segregation is accomplished by adding sufficient energy to initiate movement of germanium atoms relative to the silicon atoms in the crystalline structure of the upper portions 64P of the fins 60. The germanium atoms at the subsurface of the fins 60 in the region 50P thus exchange places with the depassivated silicon atoms at the surface of the fins 60.

In some embodiments, the addition of energy for hydrogen desorption and the addition of energy for germanium segregation are both simultaneously accomplished by thermal treatment (e.g., annealing) of the fins 6o, and is performed in a chamber such as an anneal chamber. The anneal may be a rapid thermal anneal (RTA), a spike anneal, a furnace anneal, or the like. In some embodiments, the anneal is performed at a temperature in the range of about 250° C. to about 500° C. (such as in the range of about 300° C. to about 450° C.), and for a duration of less than about 60 minutes (such as in the range of about 5 minutes to about 60 minutes). Such a temperature and time is great enough to bring the upper portions 64P of the fins 60 to germanium sorption equilibrium, but low enough to avoid damaging the fins 60. The duration of the anneal is inversely related to the temperature of the anneal, e.g., anneals at a higher temperature may be performed for a lesser duration. As noted above, the anneal is performed in a hydrogen-starved environment. In some embodiments, the hydrogen-starved environment is a low-pressure environment, such as a vacuum (e.g., less than about 1 Torr). In some embodiments, the hydrogen-starved environment includes gases other than hydrogen (or its isotopes), such as nitrogen, helium, argon, or the like. During the anneal, the free hydrogen atoms at the edges of the upper portions 64P of the fins 6o is outgassed to the processing chamber. The outgassed hydrogen atoms may then be removed from the chamber while annealing. In embodiments where the hydrogen-starved environment is a vacuum, the outgassed hydrogen atoms are pumped out of the environment. In embodiments where the hydrogen-starved environment is a gas, the outgassed hydrogen atoms are removed by continuously flowing the gas through the processing chamber, or by purging the gas. Further, during the anneal, the germanium atoms in the upper portions 64P of the fins 60 segregates at the surfaces of the fins 60 to form the germanium-rich layers 78. The thickness of the germanium-rich layers 78 depends on the parameters of the germanium condensation process 76, such as the temperature and duration of the anneal. By varying the parameters of the germanium condensation process 76, the width of the germanium-rich layers 78 can be varied from a few monolayers to several nanometers. For example, a longer or higher-temperature anneal may increase the width of the germanium-rich layers 78. The germanium-rich layers 78 are formed to a thickness $T_1$. In some embodiments, the thickness $T_1$ is in the range of about 0.5 nm to about 5 nm.

Figure 10:
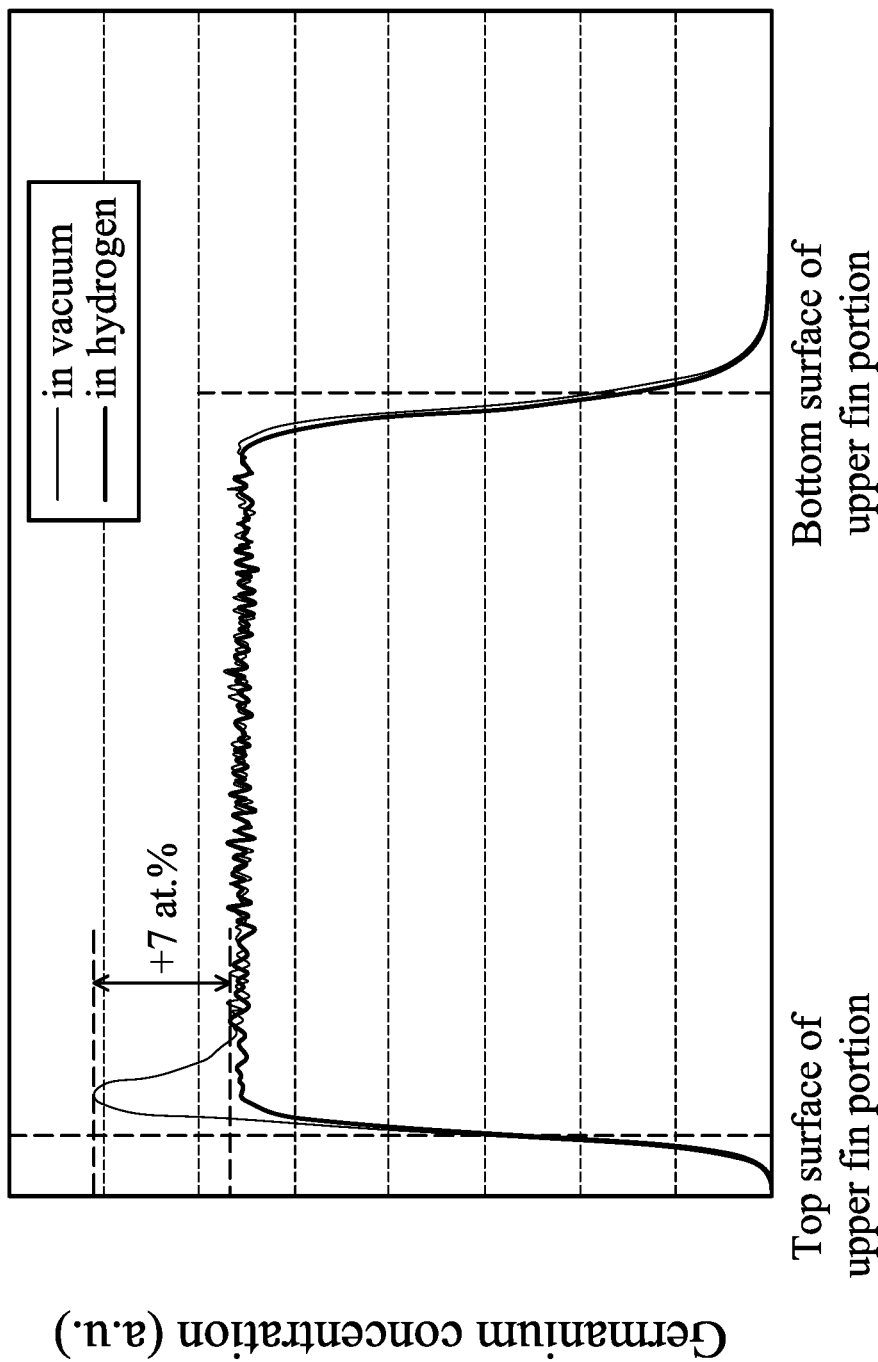
FIG. 10 shows fin germanium concentration data, in accordance with some embodiments.

FIG. 10 shows fin germanium concentration data for an embodiment where the thermal treatment is an anneal performed in a vacuum, at a temperature in the range of about 400° C. to about 450° C., and for a duration of about 60 minutes. FIG. 10 plots the relative germanium concentration in a fin as a function of depth along a direction $D_1$ extending from a top surface of the fin (shown in FIG. 9). As can be seen, after segregation under a vacuum, the germanium concentration at the surface of the fins 60 was about 7 at. % greater than the initial concentration. The germanium concentration increase at the surface is much more pronounced at a temperature in the range of about 400° C. to about 450° C. and a duration of about 60 minutes, as compared to other anneal temperatures and durations.

Although the second semiconductor region 54 (see FIG. 3) is formed with a low initial germanium concentration, forming the germanium-rich layers 78 allows the germanium concentration of the fins 60 in the region 50P to be increased. Forming the fins 60 in the region 50P with a low initial germanium concentration may help avoid deformation of the fins 60 and may help decrease the line-edge roughness of the fins 60. Increasing the germanium concentration of the fins 60 in the region 50P after formation may allow the carrier mobility of the fins 60 to be increased without the downside of increased fin deformation. The final strain of the fins 60 in the region 50P may also be higher than the initial strain of the fins 60. Further, because the germanium-rich layers 78 are near the sidewalls of the fins 60, they are proximate the gates of the subsequently formed p-type devices in the region 50P, allowing the channel region mobility of the resulting FinFETs to be increased.

Advantageously, the germanium condensation process 76 may only affect the fins 60 in the region 50P. Because first semiconductor region 52 is free from germanium, the fins 60 in the region 50N may be exposed to the germanium condensation process 76 without substantially changing any germanium concentration of the fins 60 in the region 50N. Although the surface silicon atoms of the fins 60 in the region 50N are depassivated by hydrogen desorption, the material composition at the subsurface of the fins 60 in the region 50N remains unchanged. Masking of the region 50N during the germanium condensation process 76 may thus be avoided, reducing processing costs.

Figure 11:
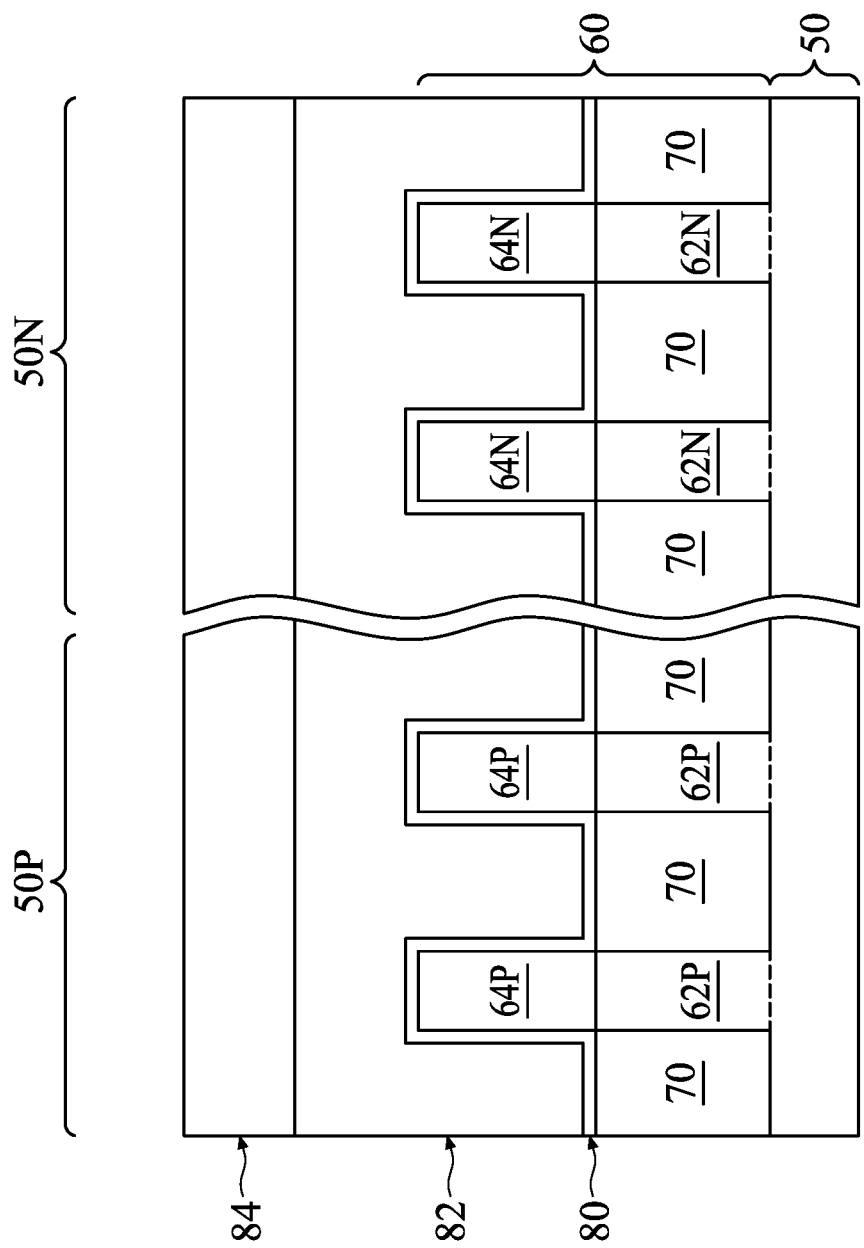

In FIG. 11, a dummy dielectric layer 80 is formed on the fins 60. The dummy dielectric layer 80 may be, for example, silicon oxide, silicon nitride, a combination thereof, or the like, and may be deposited or thermally grown according to acceptable techniques. A dummy gate layer 82 is formed over the dummy dielectric layer 80, and a mask layer 84 is formed over the dummy gate layer 82. The dummy gate layer 82 may be deposited over the dummy dielectric layer 80 and then planarized, such as by a CMP. The mask layer 84 may be deposited over the dummy gate layer 82. The dummy gate layer 82 may be a conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 82 may be deposited by physical vapor deposition (PVD), CVD, sputter deposition, or other techniques known and used in the art for depositing conductive materials. The dummy gate layer 82 may be made of other materials that have a high etching selectivity from the etching of isolation regions. The mask layer 84 may include, for example, SiN, SiON, or the like. In this example, a single dummy gate layer 82 and a single mask layer 84 are formed across the region 50N and the region 50P. It is noted that the dummy dielectric layer 80 is shown covering the STI regions 70, extending between the between the dummy gate layer 82 and the STI regions 70. In some embodiments, the dummy dielectric layer 80 covers only the fins 60.

FIGS. 12A through 20B illustrate various additional steps in the manufacturing of embodiment devices. Although FIGS. 12A through 20B illustrate features in the region 50P, it should be appreciated that the structures illustrated may be applicable to both the region 50N and the region 50P. Differences (if any) in the structures of the region 50N and the region 50P are described in the text accompanying each figure.

Figure 12A:
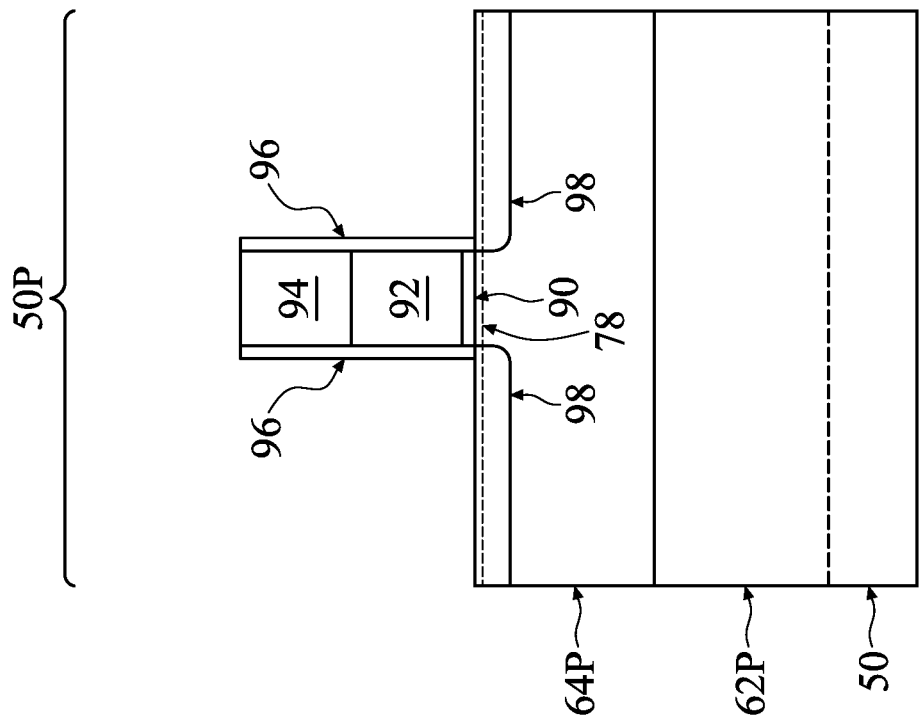
Figure 12B:
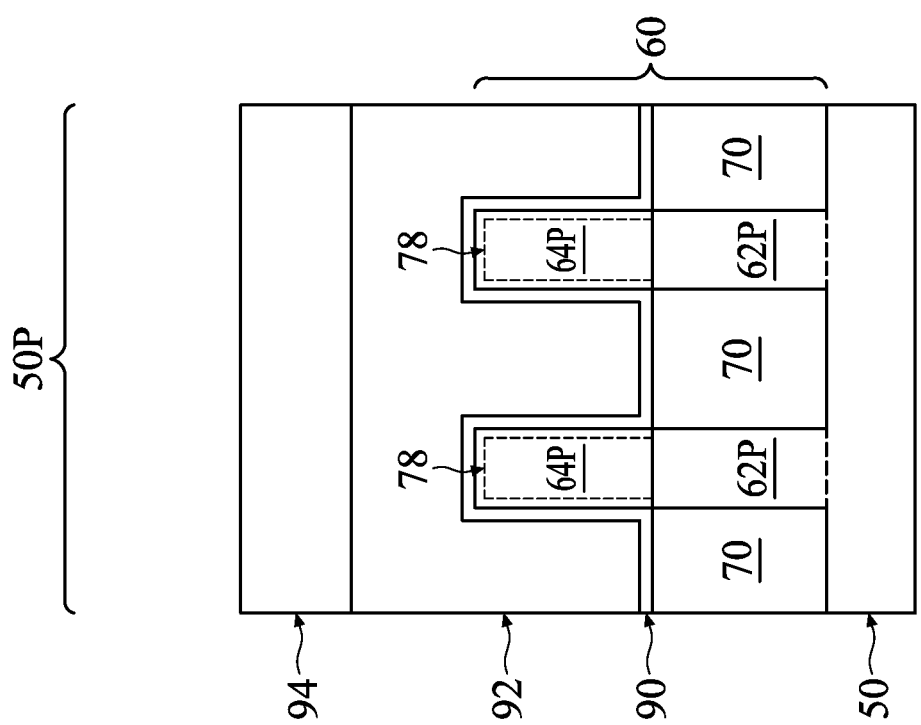

In FIGS. 12A and 12B, the mask layer 84 is patterned using acceptable photolithography and etching techniques to form masks 94. The pattern of the masks 94 then may be transferred to the dummy gate layer 82 to form dummy gates 92. The pattern of the masks 94 may also be transferred to the dummy dielectric layer 80 by an acceptable etching technique to form a dummy gate dielectric layer 90. The dummy gates 92 (and optionally dummy gate dielectric layer 90) cover respective channel regions of the fins 60. The pattern of the masks 94 may be used to physically separate each of the dummy gates 92 from adjacent dummy gates 92. The dummy gates 92 may also have a lengthwise direction substantially perpendicular to the lengthwise direction of respective fins 60.

Further, gate seal spacers 96 can be formed on exposed surfaces of the dummy gates 92, the masks 94, and/or the fins 60. A thermal oxidation or a deposition followed by an anisotropic etch may form the gate seal spacers 96.

After the formation of the gate seal spacers 96, implants for lightly doped source/drain (LDD) regions 98 may be performed. In the embodiments with different device types, a mask, such as a photoresist, may be formed over the region 50N, while exposing the region 50P, and appropriate type (e.g., p-type) impurities may be implanted into the exposed fins 60 in the region 50P. The mask may then be removed. Subsequently, a mask, such as a photoresist, may be formed over the region 50P while exposing the region 50N, and appropriate type impurities (e.g., n-type) may be implanted into the exposed fins 60 in the region 50N. The mask may then be removed. The n-type impurities may be the any of the n-type impurities previously discussed, and the p-type impurities may be the any of the p-type impurities previously discussed. The lightly doped source/drain regions may have a concentration of impurities of about $10^{15}$ cm$^{-3}$ to about $10^{16}$ cm$^{-3}$. An anneal may be used to activate the implanted impurities. The impurities may be implanted in the fins 60 at an angle, and may experience diffusion during the anneal. As a result, the LDD regions 98 extend under the gate seal spacers 96 (and possibly edge portions of the dummy gates 92). Further, the LDD regions 98 in the region 50P overlap with the germanium-rich layers 78, and so upper portions of the LDD regions 98 in the region 50P have a higher germanium concentration than lower portions of the LDD regions 98 in the region 50P.

Figure 13B:
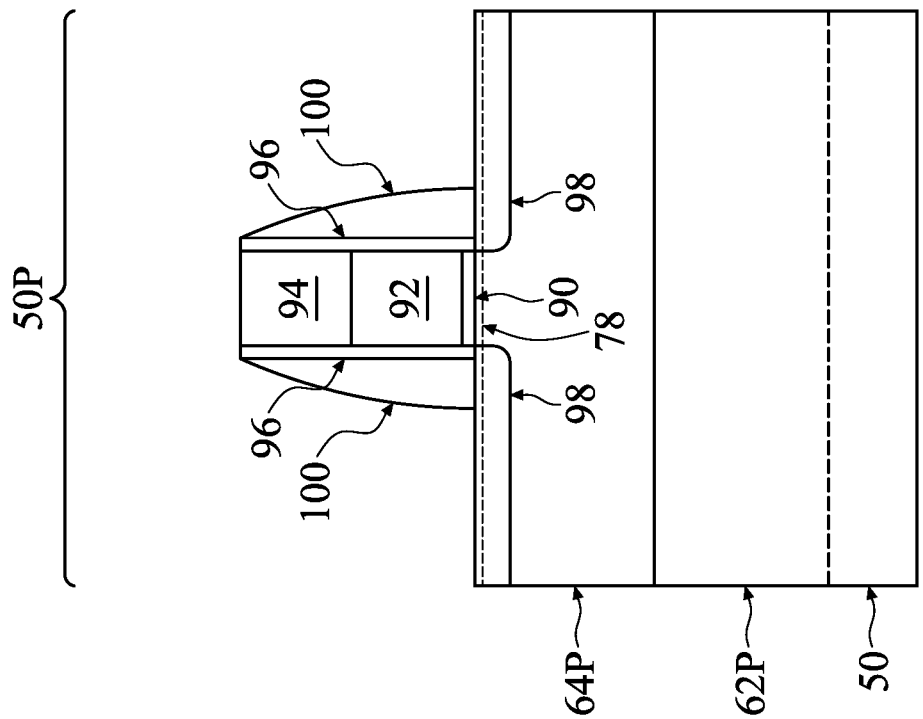
Figure 13A:
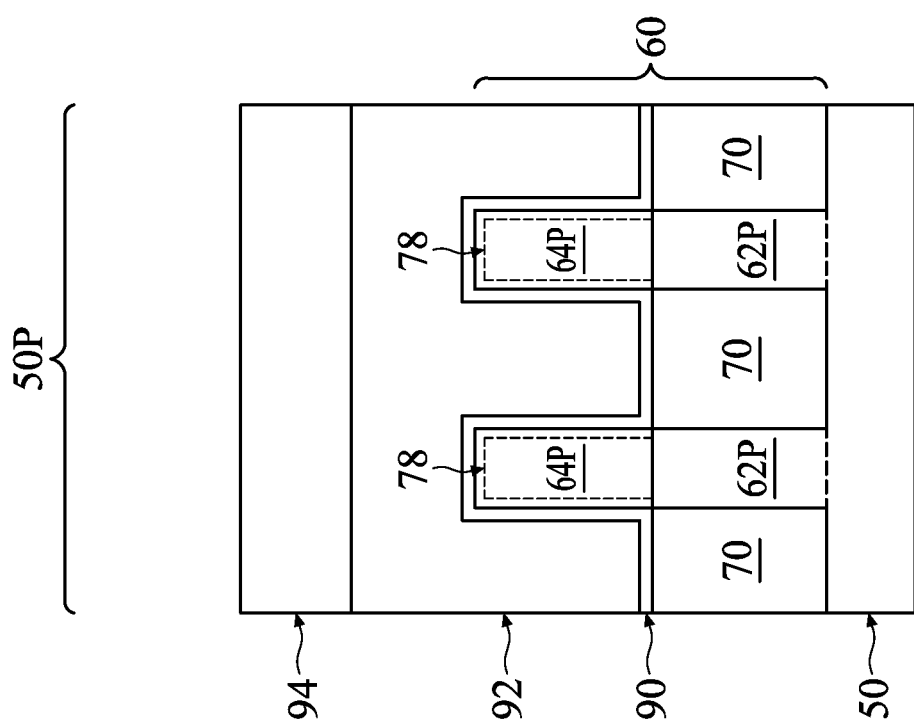

In FIGS. 13A and 13B, gate spacers 100 are formed on the gate seal spacers 96 along sidewalls of the dummy gates 92 and the masks 94. The gate spacers 100 may be formed by conformally depositing an insulating material and subsequently anisotropically etching the insulating material. The insulating material of the gate spacers 100 may be silicon nitride, SiCN, a combination thereof, or the like. The gate spacers 100 extend over upper portions 64 of the fins 60 and, in the region 50P, along the germanium-rich layers 78.

Figure 14B:
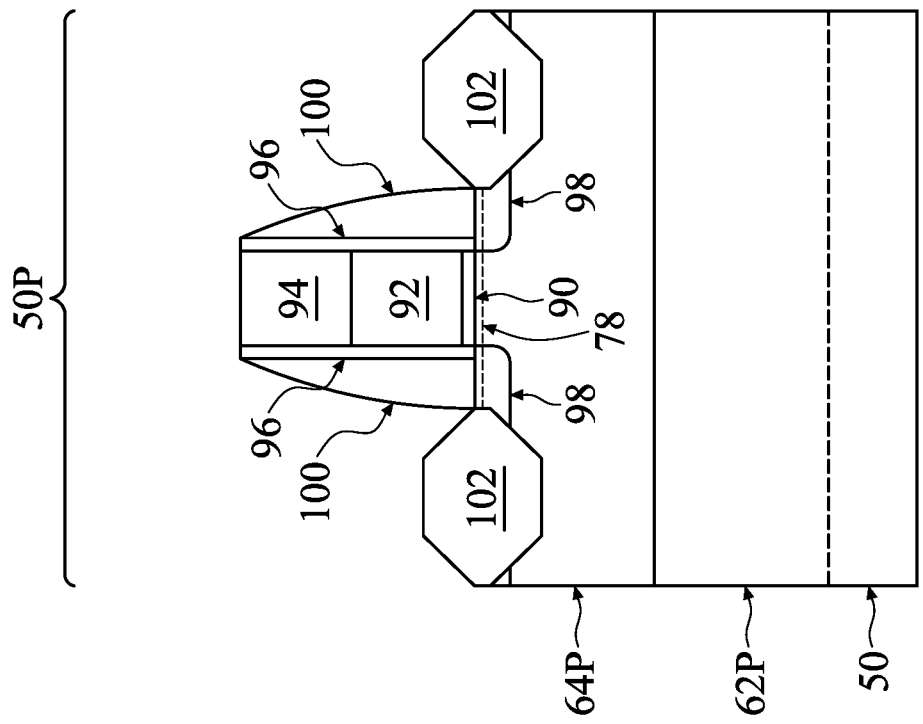
Figure 14A:
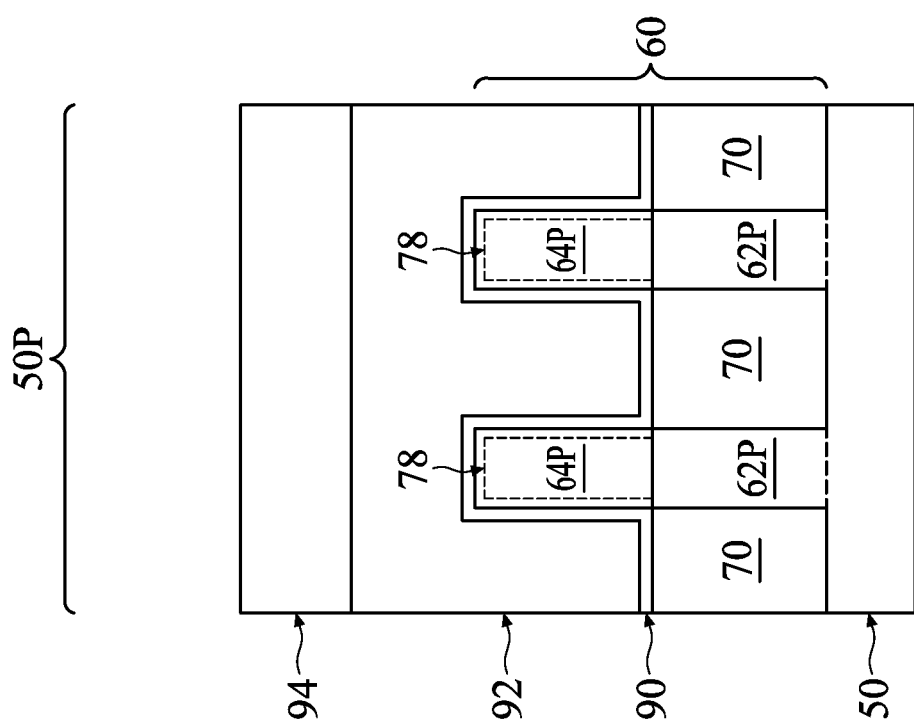
Figure 14C:
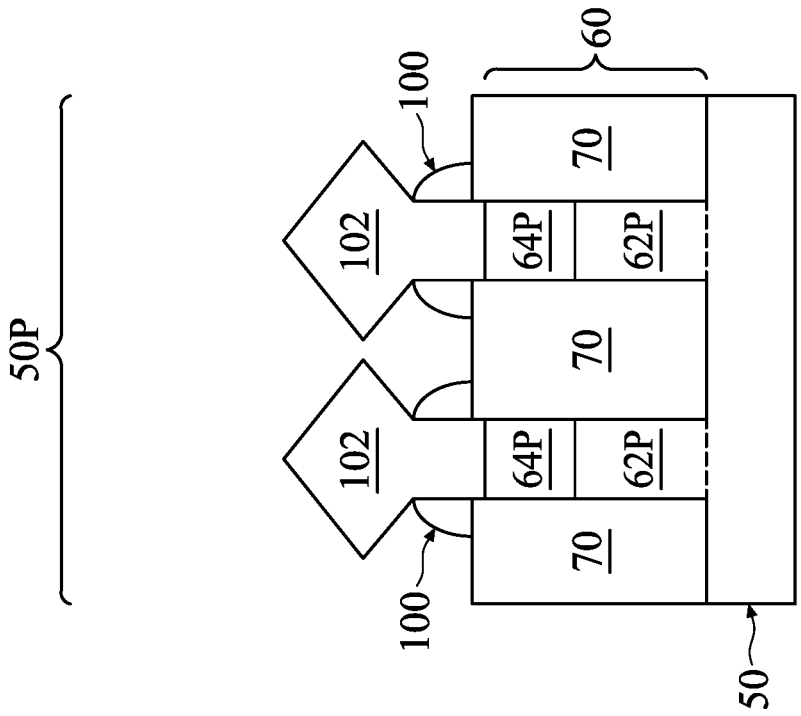
Figure 14D:
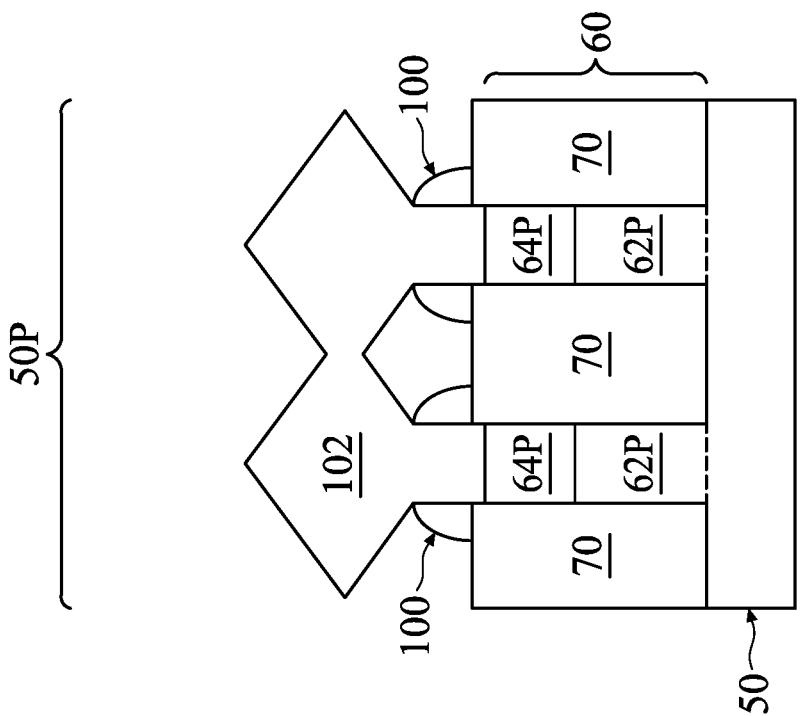

In FIGS. 14A and 14B epitaxial source/drain regions 102 are formed in the fins 60 to exert stress in the respective channel regions, thereby improving performance. The epitaxial source/drain regions 102 are formed in the fins 60 such that each dummy gate 92 is disposed between respective neighboring pairs of the epitaxial source/drain regions 102. In some embodiments the epitaxial source/drain regions 102 may extend into, and may also penetrate through, the fins 60. In some embodiments, the gate spacers 100 and gate seal spacers 96 are used to separate the epitaxial source/drain regions 102 from the dummy gates 92 by an appropriate lateral distance so that the epitaxial source/drain regions 102 do not short out subsequently formed gates of the resulting FinFETs.

The epitaxial source/drain regions 102 in the region 50P, e.g., the PMOS region, may be formed by masking the region 50N, e.g., the NMOS region, and etching source/drain regions of the fins 60 in the region 50P to form recesses in the fins 60. Then, the epitaxial source/drain regions 102 in the region 50P are epitaxially grown in the recesses. The epitaxial source/drain regions 102 may include any acceptable material, such as appropriate for p-type FinFETs. For example, if the fin 60 is silicon germanium, the epitaxial source/drain regions 102 in the region 50P may comprise materials exerting a compressive strain in the channel region, such as SiGe, SiGeB, Ge, GeSn, or the like. The epitaxial source/drain regions 102 in the region 50P may also have surfaces raised from respective surfaces of the fins 60 and may have facets.

The epitaxial source/drain regions 102 in the region 50N, e.g., the NMOS region, may be formed by masking the region 50P, e.g., the PMOS region, and etching source/drain regions of the fins 60 in the region 50N to form recesses in the fins 60. Then, the epitaxial source/drain regions 102 in the region 50N are epitaxially grown in the recesses. The epitaxial source/drain regions 102 may include any acceptable material, such as appropriate for n-type FinFETs. For example, if the fin 60 is silicon, the epitaxial source/drain regions 102 in the region 50N may include materials exerting a tensile strain in the channel region, such as silicon, SiC, SiCP, SiP, or the like. The epitaxial source/drain regions 102 in the region 50N may have surfaces raised from respective surfaces of the fins 60 and may have facets.

The epitaxial source/drain regions 102 and/or the fins 60 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 102 may be in situ doped during growth.

As a result of the epitaxy processes used to form the epitaxial source/drain regions 102 in the region 50N and the region 50P, upper surfaces of the epitaxial source/drain regions have facets which expand laterally outward beyond sidewalls of the fins 60. In some embodiments, these facets cause adjacent source/drain regions 102 of a same FinFET to merge as illustrated by FIG. 14C. In other embodiments, adjacent source/drain regions 102 remain separated after the epitaxy process is completed as illustrated by FIG. 14D.

Figures 15A, 15B:
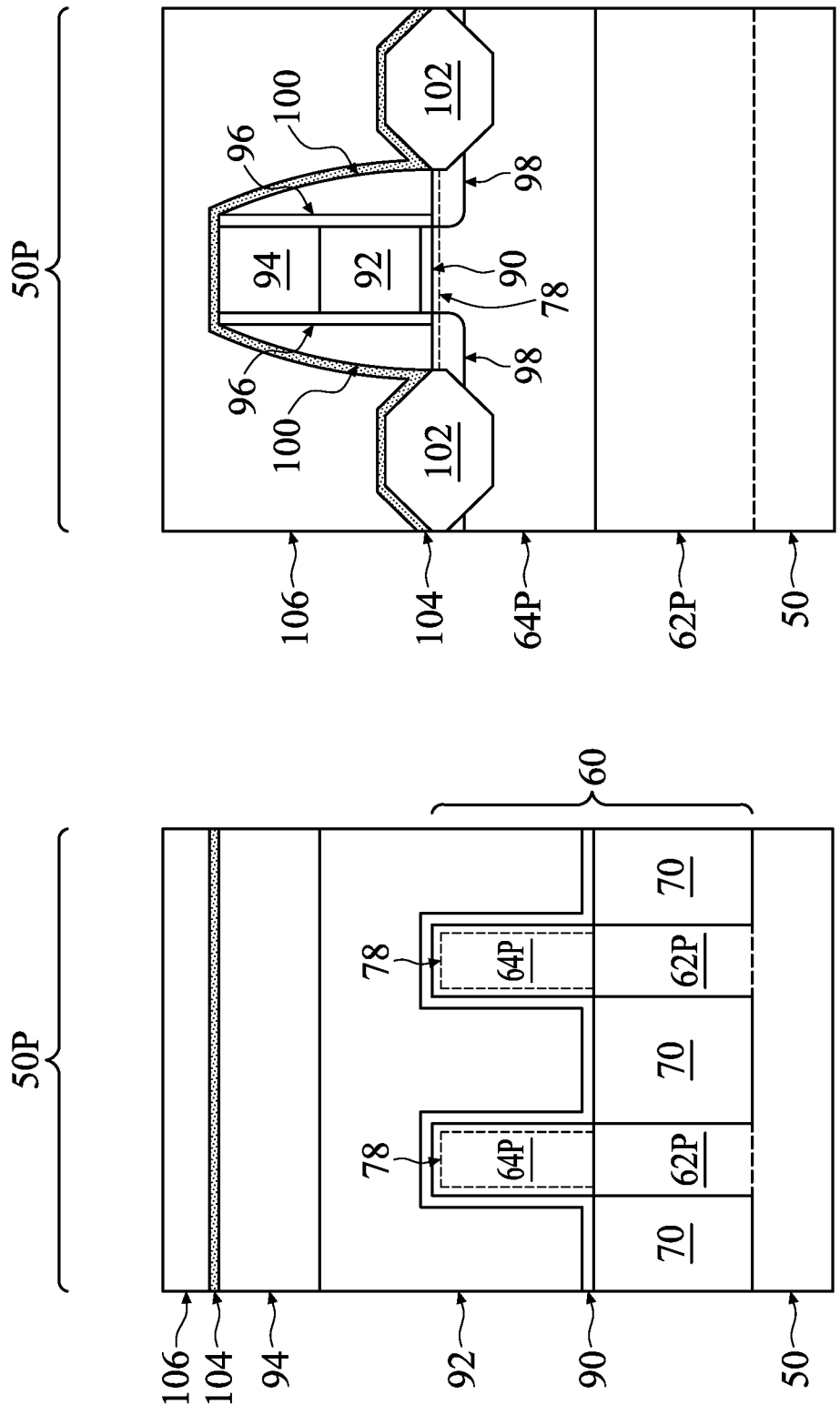

In FIGS. 15A and 15B, a contact etch stop layer (CESL) 104 is deposited over the substrate 50. The CESL 104 may comprise a dielectric material, such as silicon nitride, silicon oxide, silicon oxynitride, or the like. A first inter-layer dielectric (ILD) 106 is then deposited over the CESL 104. The first ILD 106 may be formed of a dielectric material, and may be deposited by any suitable method, such as CVD, plasma-enhanced CVD (PECVD), or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may be used. The CESL 104 is thus disposed between the first ILD 106 and the epitaxial source/drain regions 102, the masks 94, and the gate spacers 100. The materials of the CESL 104 and first ILD 106 have different etch rates relative a same etching process.

Figure 16B:
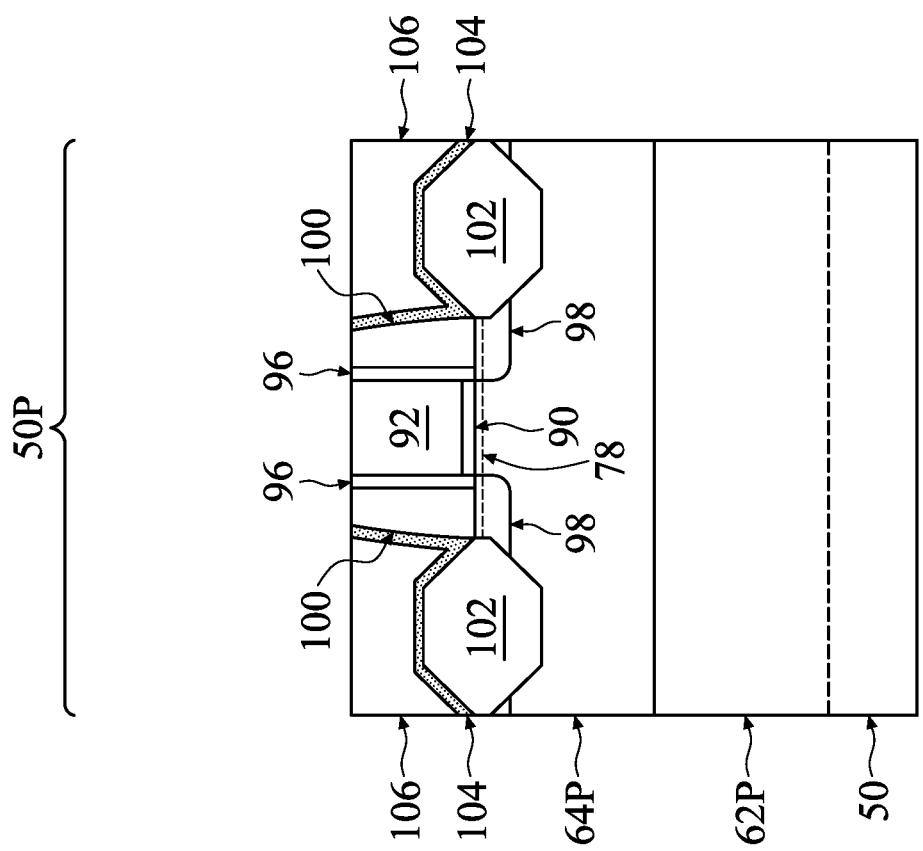
Figure 16A:
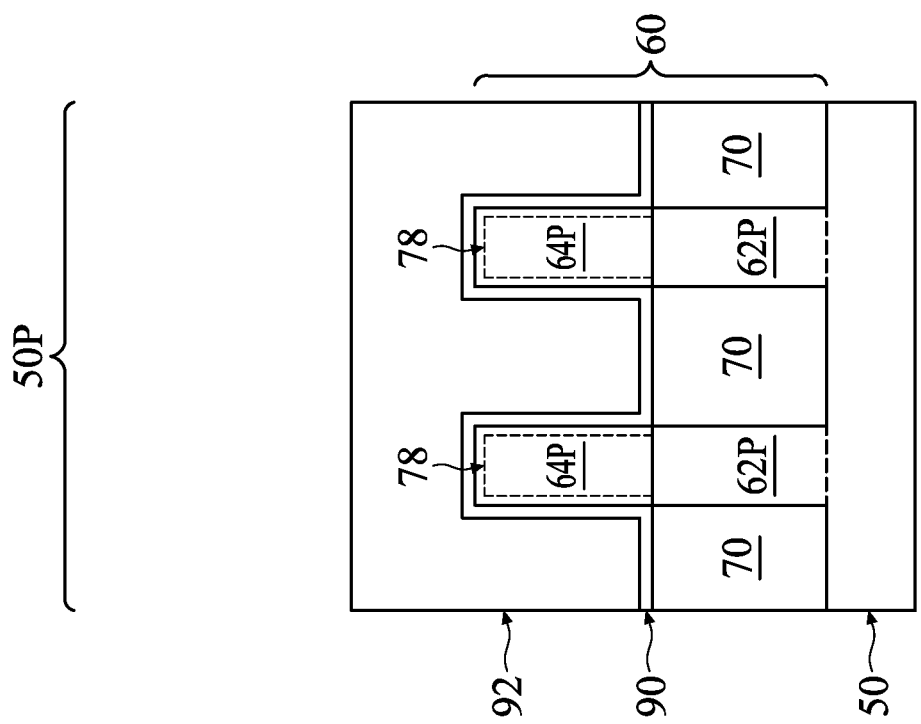

In FIGS. 16A and 16B, a planarization process, such as a CMP, may be performed to level the top surface of the first ILD 106 with the top surfaces of the dummy gates 92 or the masks 94. The planarization process may also remove the masks 94 on the dummy gates 92, and portions of the gate seal spacers 96 and the gate spacers 100 along sidewalls of the masks 94 and dummy gates 92. After the planarization process, top surfaces of the dummy gates 92, the gate seal spacers 96, the gate spacers 100, and the first ILD 106 are level. Accordingly, the top surfaces of the dummy gates 92 are exposed through the first ILD 106. In some embodiments, the masks 94 may remain, in which case the planarization process levels the top surface of the first ILD 106 with the top surfaces of the masks 94.

Figure 17B:
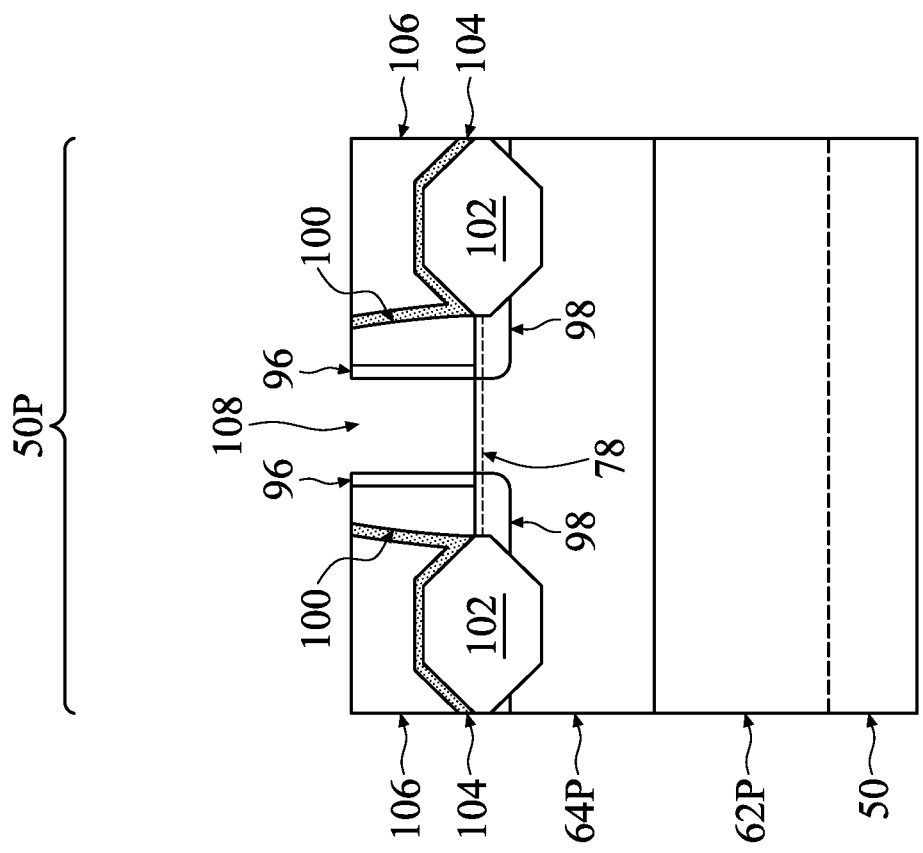
Figure 17A:
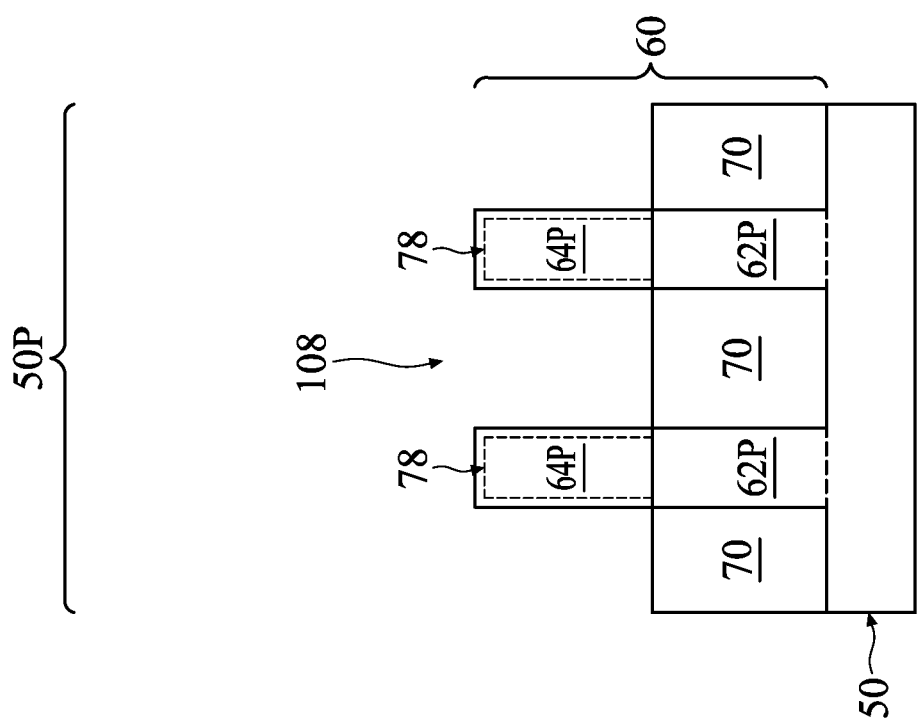

In FIGS. 17A and 17B, the dummy gates 92, and the masks 94 if present, are removed in an etching step(s), so that recesses 108 are formed. Portions of the dummy gate dielectric layer 90 in the recesses 108 may also be removed. In some embodiments, only the dummy gates 92 are removed and the dummy gate dielectric layer 90 remains and is exposed by the recesses 108. In some embodiments, the dummy gate dielectric layer 90 is removed from recesses 108 in a first region of a die (e.g., a core logic region) and remains in recesses 108 in a second region of the die (e.g., an input/output region). In some embodiments, the dummy gates 92 are removed by an anisotropic dry etch process. For example, the etching process may include a dry etch process using reaction gas(es) that selectively etch the dummy gates 92 without etching the first ILD 106 or the gate spacers 100. Each recess 108 exposes a channel region of a respective fin 60. Notably, the recesses 108 expose the germanium-rich layers 78 of the fins 60 in the region 50P. Each channel region is disposed between neighboring pairs of the epitaxial source/drain regions 102. During the removal, the dummy gate dielectric layer 90 may be used as an etch stop layer when the dummy gates 92 are etched. The dummy gate dielectric layer 90 may then be optionally removed after the removal of the dummy gates 92.

Figures 18A, 18B:
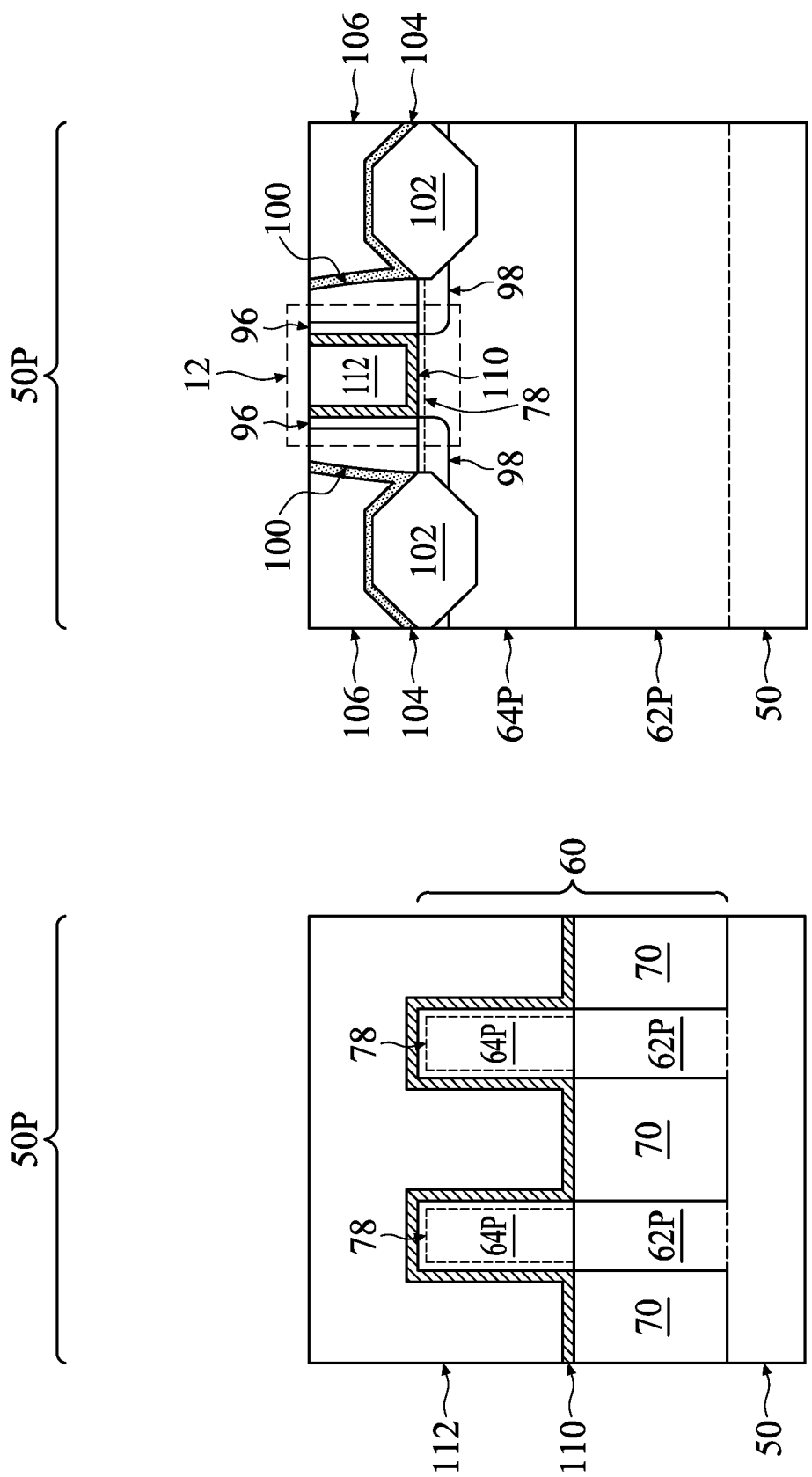

In FIGS. 18A and 18B, gate dielectric layers 110 and gate electrodes 112 are formed for replacement gates. FIG. 18C is a detailed view of a region 12 in FIG. 18B, showing additional features of the gate electrodes 112. FIGS. 18A, 18B, and 18C will be described together. The gate dielectric layers 110 are deposited conformally in the recesses 108, such as on the top surfaces and the sidewalls of the fins 60 and on sidewalls of the gate seal spacers 96/gate spacers 100. Notably, the gate dielectric layers 110 are on the germanium-rich layers 78 in the region 50P. The gate dielectric layers 110 may also be formed on the top surface of the first ILD 106. In accordance with some embodiments, the gate dielectric layers 110 comprise silicon oxide, silicon nitride, or multilayers thereof. In some embodiments, the gate dielectric layers 110 include a high-k dielectric material, and in these embodiments, the gate dielectric layers 110 may have a k value greater than about 7.0, and may include a metal oxide or a silicate of Hf, Al, Zr, La, Mg, Ba, Ti, Pb, and combinations thereof. The formation methods of the gate dielectric layers 110 may include Molecular-Beam Deposition (MBD), atomic layer deposition (ALD), PECVD, and the like. In embodiments where portions of the dummy gate dielectric layer 90 remains in the recesses 108, the gate dielectric layers 110 include a material of the dummy gate dielectric layer 90 (e.g., SiO$_2$).

The gate electrodes 112 are deposited over the gate dielectric layers 110, respectively, and fill the remaining portions of the recesses 108. The gate electrodes 112 may include a metal-containing material such as TiN, TiO, TaN, TaC, Co, Ru, Al, W, combinations thereof, or multi-layers thereof. For example, the gate electrode 112 may comprise any number of liner layers 112A, any number of work function tuning layers 112B, and a fill material 112C. After the filling of the gate electrodes 112, a planarization process, such as a CMP, may be performed to remove the excess portions of the gate dielectric layers 110 and the material of the gate electrodes 112, which excess portions are over the top surface of the first ILD 106. The remaining portions of material of the gate electrodes 112 and the gate dielectric layers 110 thus form replacement gates of the resulting FinFETs. Each gate dielectric layer 110 and corresponding overlying gate electrode 112 may be collectively referred to as a "gate stack." Each gate stack extends along sidewalls of a channel region of the fins 60 (e.g., the germanium-rich layers 78 in the region 50P).

The formation of the gate dielectric layers 110 in the region 50N and the region 50P may occur simultaneously such that the gate dielectric layers 110 in each region are formed from the same materials, and the formation of the gate electrodes 112 may occur simultaneously such that the gate electrodes 112 in each region are formed from the same materials. In some embodiments, the gate dielectric layers 110 in each region may be formed by distinct processes, such that the gate dielectric layers 110 may be different materials, and/or the gate electrodes 112 in each region may be formed by distinct processes, such that the gate electrodes 112 may be different materials. Various masking steps may be used to mask and expose appropriate regions when using distinct processes.

In FIGS. 19A and 19B, gate masks 114 are formed over the gate stacks. In accordance with some embodiments, the gate stacks are recessed so that a recess is formed directly over each gate stack, e.g., between opposing portions of the gate spacers 100. One or more layers of dielectric material, such as silicon nitride, silicon oxynitride, or the like, are filled in the recesses. A planarization process is performed to remove excess portions of the dielectric material extending over the first ILD 106. Remaining portions of the dielectric material in the recesses form the gate masks 114. Subsequently formed gate contacts will penetrate through the gate masks 114 to contact the top surface of the recessed gate electrode 112. A second ILD 116 is then deposited over the gate masks 114 and first ILD 106. In some embodiment, the second ILD 116 is a flowable film formed by a flowable CVD method. In some embodiments, the second ILD 116 is formed of a dielectric material such as PSG, BSG, BPSG, USG, or the like, and may be deposited by any suitable method, such as CVD and PECVD.

Figure 20B:
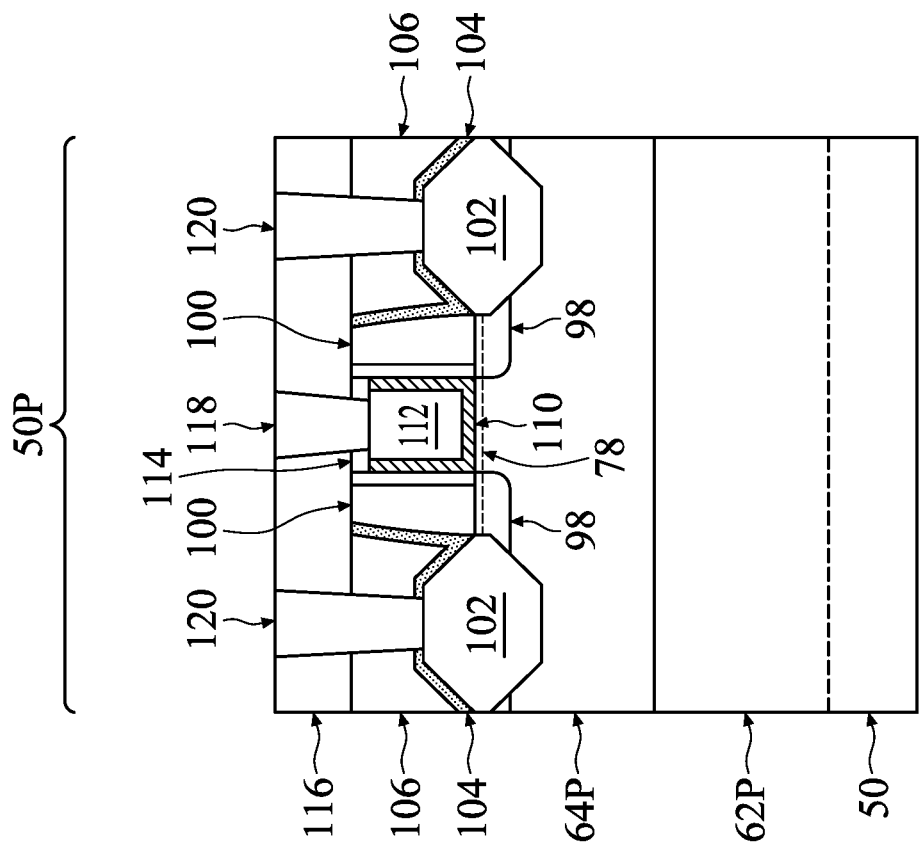
Figure 20A:
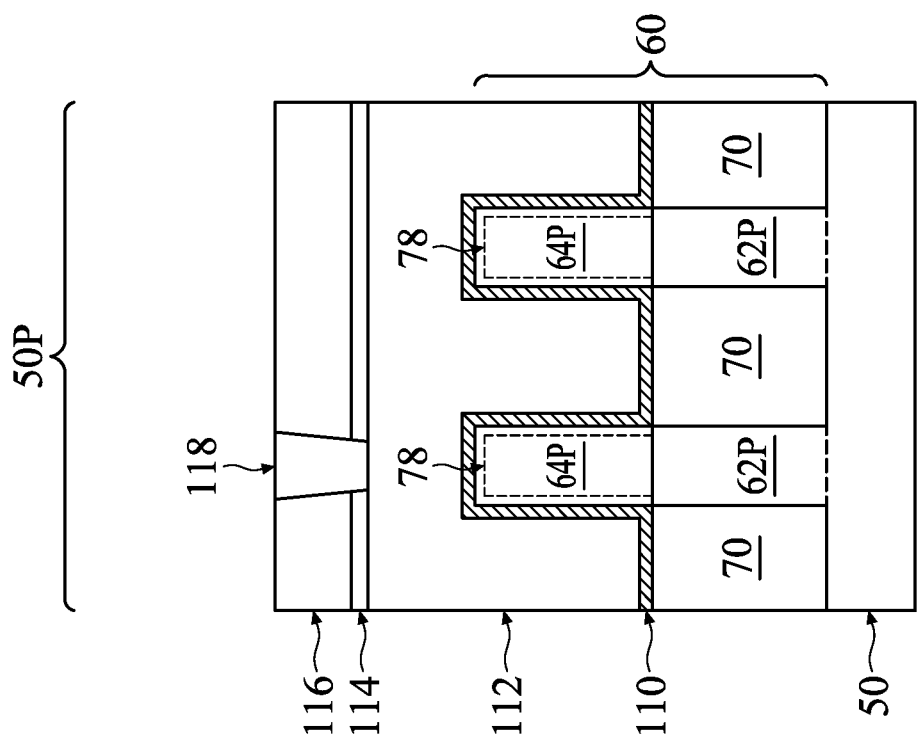

In FIGS. 20A and 20B, gate contacts 118 and source/drain contacts 120 are formed through the second ILD 116 and the first ILD 106 in accordance with some embodiments. Openings for the source/drain contacts 120 are formed through the first ILD 106 and second ILD 116, and openings for the gate contact 118 are formed through the second ILD 116 and the gate masks 114. The openings may be formed using acceptable photolithography and etching techniques, with the CESL 104 acting as a stop layer during etching of the first ILD 106 and second ILD 116. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 116. The remaining liner and conductive material form the source/drain contacts 120 and gate contacts 118 in the openings. An anneal process may be performed to form a silicide at the interface between the epitaxial source/drain regions 102 and the source/drain contacts 120. The source/drain contacts 120 are physically and electrically coupled to the epitaxial source/drain regions 102, and the gate contacts 118 are physically and electrically coupled to the gate electrodes 112. The source/drain contacts 120 and gate contacts 118 may be formed in different processes, or may be formed in the same process. Although shown as being formed in the same cross-sections, it should be appreciated that each of the source/drain contacts 120 and gate contacts 118 may be formed in different cross-sections, which may avoid shorting of the contacts.

Embodiments may achieve advantages. Forming the upper portions 64P of the fins 60 with a low germanium concentration may help avoid deformation of fin sidewalls during the etching process(es) for forming the fins 60 (see FIG. 4). Increasing the germanium concentration of the upper portions 64P of the fins 60 after formation by performing the germanium condensation process 76 (see FIG. 8) may allow the carrier mobility of the fins 60 in the region 50P to be increased after the etching process(es). The channel region mobility of the resulting p-type FinFETs in the region 50P may therefore be increased, and the risk of fin deformation during manufacturing may be lowered.

Figure 21B:
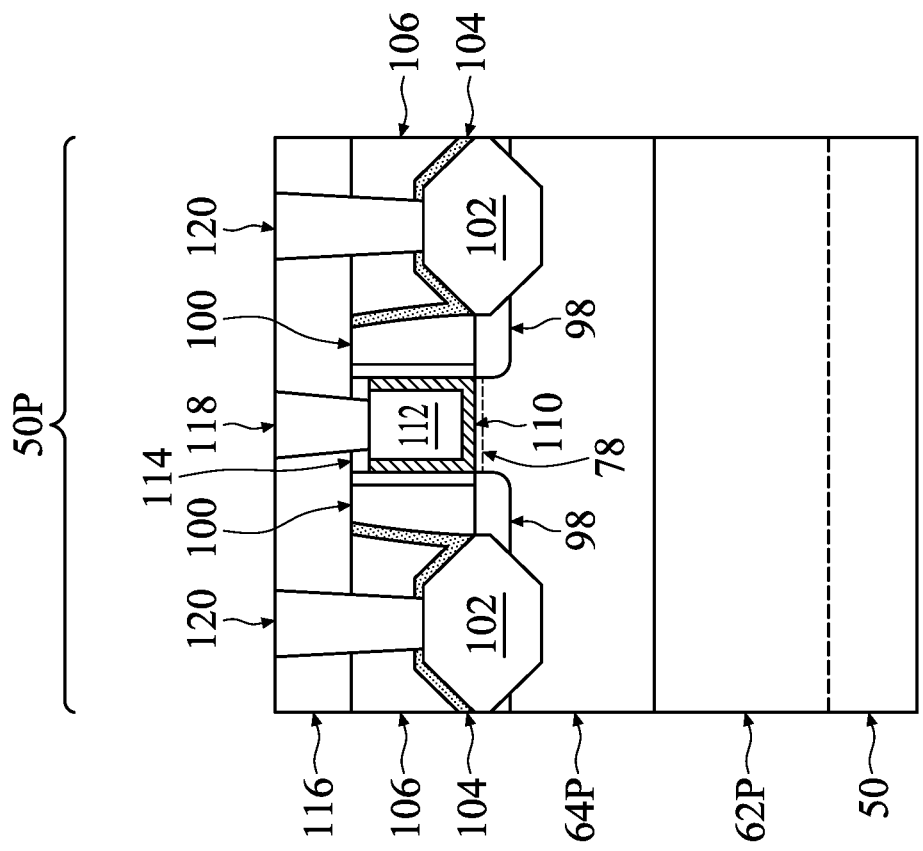
FIGS. 21A and 21B are cross-sectional views of a FinFET, in accordance with some other embodiments.
Figure 21A:
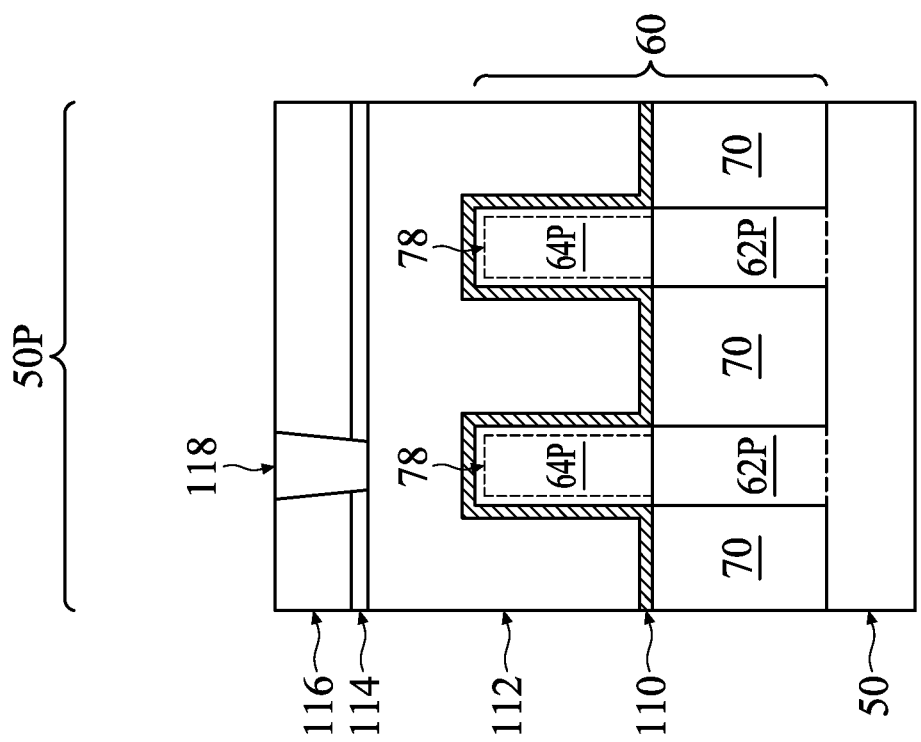

FIGS. 21A and 21B are cross-sectional views of a FinFET, in accordance with some other embodiments. FIG. 21A is illustrated along the cross-section A-A in FIG. 1, and FIG. 21B is illustrated along the cross-section B-B in FIG. 1, except for multiple fins/FinFETs. In this embodiment, the germanium condensation process 76 is performed after the dummy gates 92 and dummy gate dielectric layers 90 are removed (see FIGS. 17A and 17B), but before the gate dielectric layers 110 and gate electrodes 112 are formed (see FIGS. 18A, 18B, and 18C). In such embodiments, the germanium-rich layers 78 only extend along portions of the fins 60 exposed by the recesses 108 (e.g., along the channel regions of the resulting FinFETs), and the LDD regions 98 may have a uniform germanium concentration. Thus, in this embodiment, the gate dielectric layers 110 extend along the germanium-rich layers 78, but the gate spacers 100 do not extend along the germanium-rich layers 78 (e.g., the gate spacers 100 extend along portions of the fins 60 that are substantially free from the germanium-rich layers 78).

Figure 22:
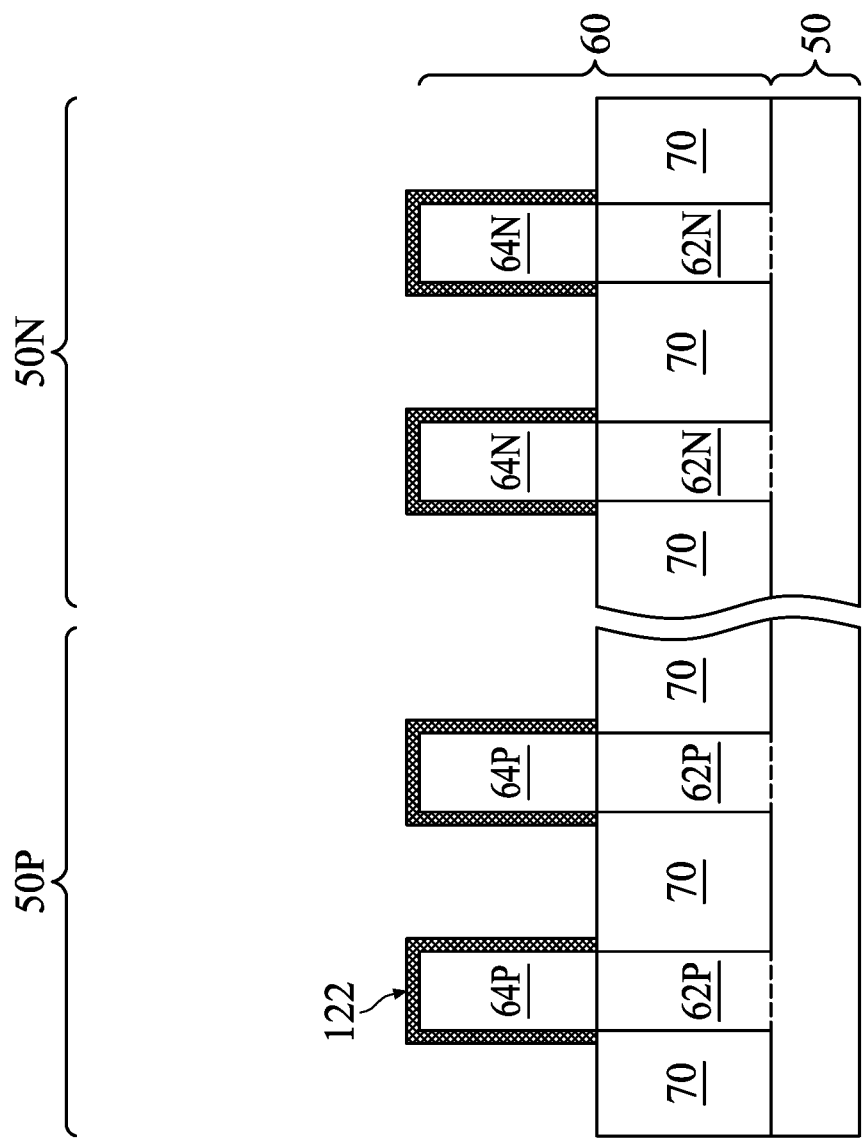
FIGS. 22, 23A, 23B, 24A, 24B, 25A, and 25B are cross-sectional views of intermediate stages in the manufacturing of FinFETs, in accordance with some other embodiments.
Figure 23B:
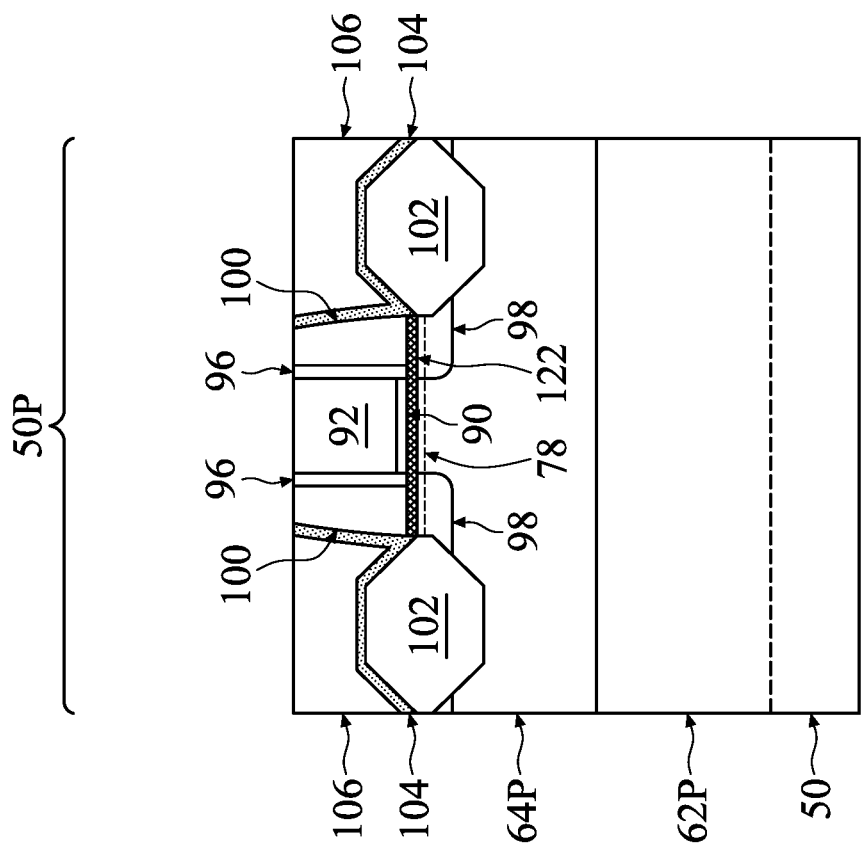
Figure 23A:
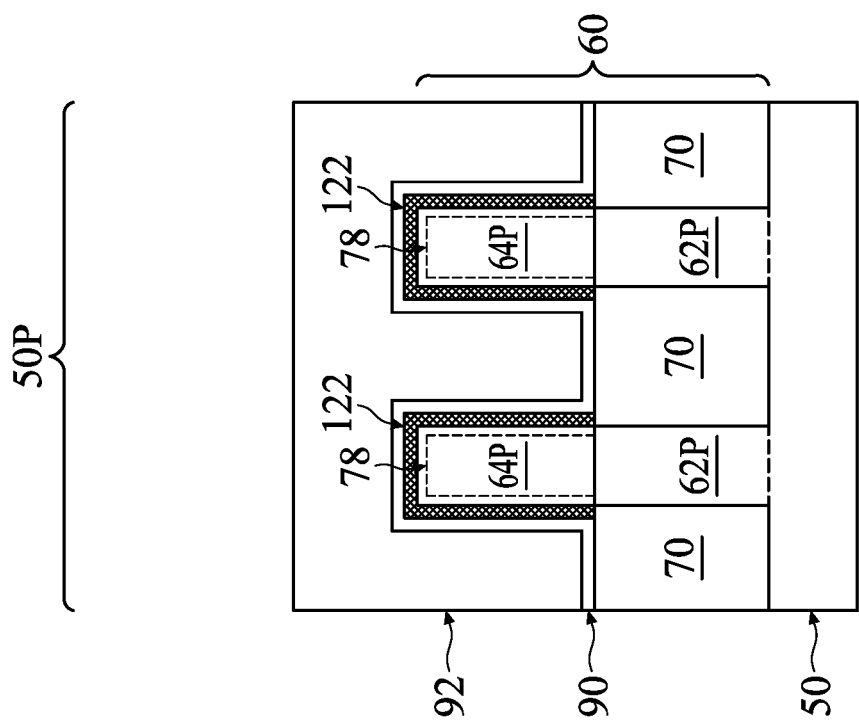
Figure 24B:
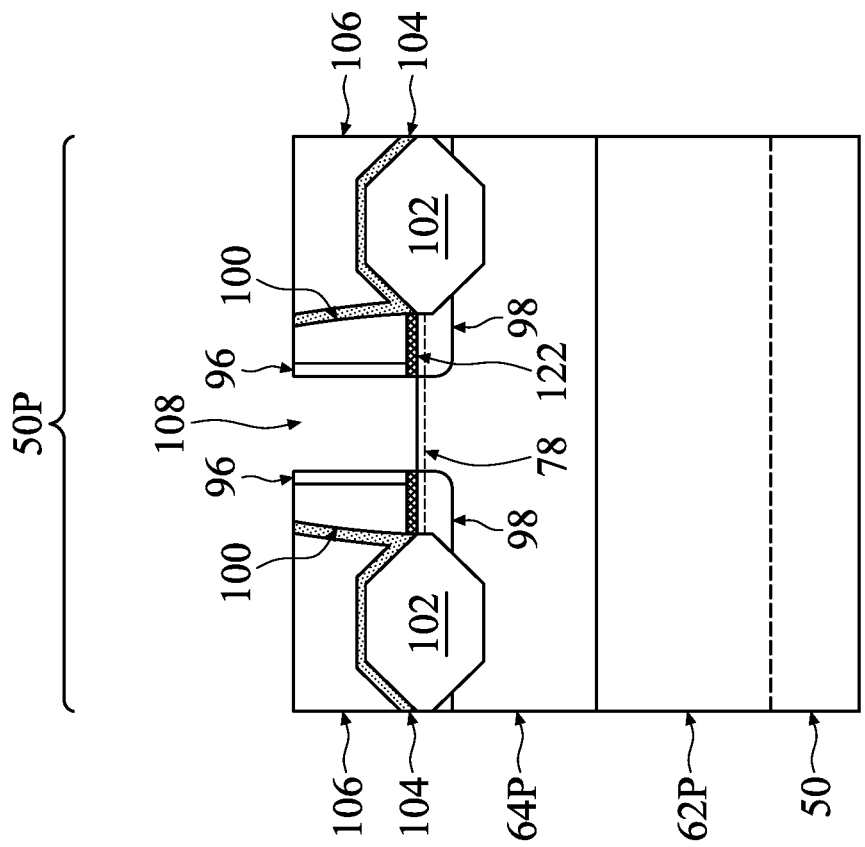
Figure 24A:
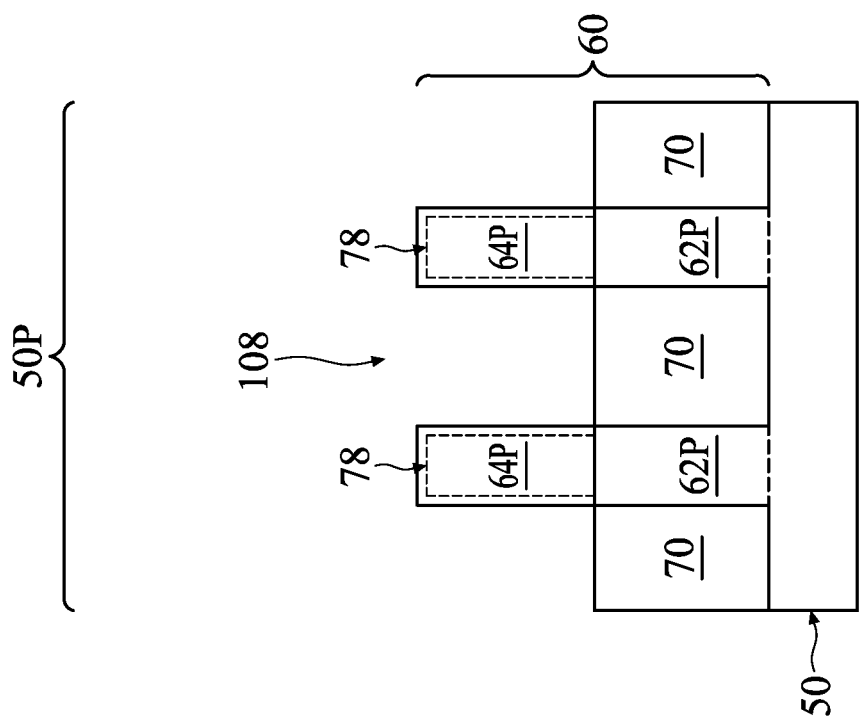
Figures 25A, 25B:
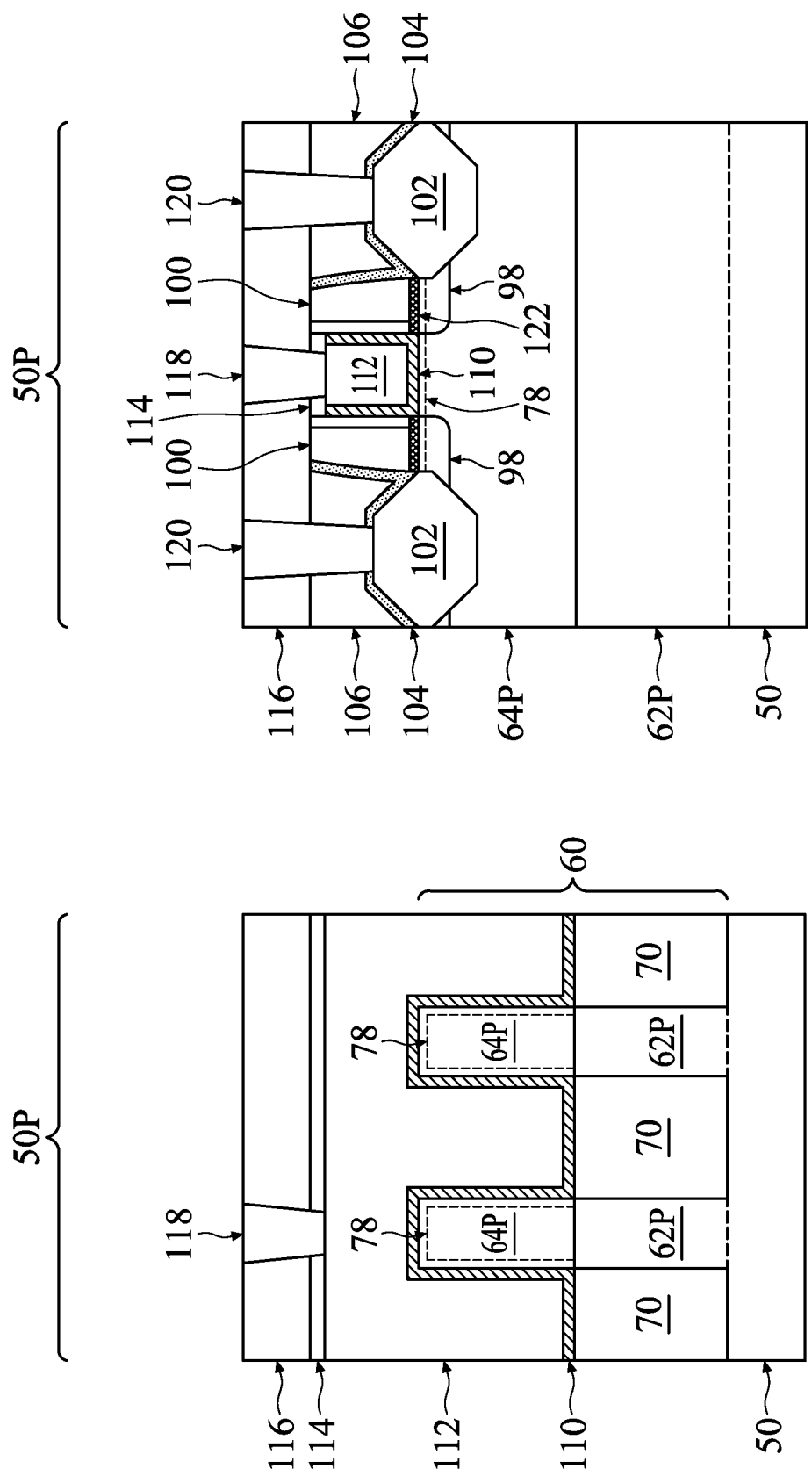

FIGS. 22 through 25B are cross-sectional views of intermediate stages in the manufacturing of FinFETs, in accordance with some other embodiments. FIGS. 22, 23A, 24A, and 25A are illustrated along the cross-section A-A in FIG. 1, and FIGS. 23B, 24B, and 25B are illustrated along the cross-section B-B in FIG. 1, except for multiple fins/FinFETs. In FIG. 22, protective caps 122 are formed on the exposed portions of the fins 60 after the germanium condensation process 76 is performed. Germanium oxidizes more easily than silicon, and so after the germanium-rich layer 78 are formed, the upper portions 64P of the fins 6o are at a greater risk of oxidizing. Forming the protective caps 122 may help avoid oxidation during subsequent processing. The protective caps 122 are a semiconductor material, such as silicon, silicon carbide, a III-V compound semiconductor, a II-VI compound semiconductor, or the like. In an embodiment, the protective caps 122 are silicon and are epitaxially grown on the exposed portions of the fins 6o. In FIGS. 23A and 23B, after appropriate ones of the steps described above are performed, the dummy gate dielectric layer 90 and dummy gates 92 are formed on the protective cap 122. In FIGS. 24A and 24B, after appropriate ones of the steps described above are performed, the recesses 108 are formed by removing the dummy gate dielectric layer 90 and dummy gates 92, and also by removing portions of the protective caps 122 underlying the dummy gates 92. FIGS. 25A and 25B show the resulting FinFET devices. The gate dielectric layers no and gate electrodes 112 extend through the protective caps 122. Further, the gate spacers 100 and gate seal spacers 96 are on the remaining portions of the protective caps 122.

In an embodiment, a method includes: forming a first fin extending from a substrate, the substrate including silicon, the first fin including silicon germanium; forming an isolation region around the first fin, an oxide layer being formed on the first fin during formation of the isolation region; removing the oxide layer from the first fin with a hydrogen-based etching process, silicon at a surface of the first fin being terminated with hydrogen after the hydrogen-based etching process; desorbing the hydrogen from the silicon at the surface of the first fin to depassivate the silicon; and exchanging the depassivated silicon at the surface of the first fin with germanium at a subsurface of the first fin.

In some embodiments of the method, desorbing the hydrogen and exchanging the silicon are performed with a thermal treatment process. In some embodiments of the method, the thermal treatment process includes: placing the first fin in a hydrogen-starved environment; annealing the first fin until the silicon germanium of the first fin is at sorption equilibrium; and removing the desorbed hydrogen from the hydrogen-starved environment while the silicon germanium of the first fin is at sorption equilibrium. In some embodiments of the method, the hydrogen-starved environment includes nitrogen, helium, or argon. In some embodiments of the method, the hydrogen-starved environment is a vacuum. In some embodiments of the method, annealing the first fin includes annealing the first fin at a temperature in a range of 250° C. to 500° C., and for a duration of less than 60 minutes. In some embodiments, the method further includes: forming a second fin extending from the substrate, the second fin including silicon, where the second fin is exposed to the thermal treatment process, a material composition of the second fin remaining unmodified during the thermal treatment process.

In an embodiment, a method includes: forming a first fin and a second fin extending from a substrate, the first fin including silicon germanium, the second fin including silicon; forming an oxide layer on the first fin and the second fin; removing the oxide layer from the first fin and the second fin with a hydrogen-based etching process, a surface of the first fin and a surface of the second fin being terminated with hydrogen after the hydrogen-based etching process; condensing germanium at the surface of the first fin with a hydrogen desorbing process to form a germanium-rich layer at the surface of the first fin, a material composition of a subsurface of the second fin remaining unmodified during the hydrogen desorbing process; and forming a metal gate stack over the first fin, the metal gate stack extending along the germanium-rich layer of the first fin.

In some embodiments of the method, no mask layers are formed over the second fin during the hydrogen desorbing process such that the second fin is exposed to the hydrogen desorbing process. In some embodiments, the method further includes: after condensing the germanium at the surface of the first fin, forming a dummy gate stack over the first fin; forming source/drain regions in the first fin, the source/drain regions being adjacent the dummy gate stack; removing the dummy gate stack to expose the germanium-rich layer at the surface of the first fin; and forming the metal gate stack in place of the dummy gate stack. In some embodiments, the method further includes: after condensing the germanium at the surface of the first fin, forming lightly doped source/drain (LDD) regions in the first fin, upper portions of the LDD regions having a higher germanium concentration than lower portions of the LDD regions. In some embodiments, the method further includes: after condensing the germanium at the surface of the first fin, forming gate spacers adjacent the metal gate stack, the gate spacers extending along the germanium-rich layer of the first fin. In some embodiments, the method further includes: forming a dummy gate stack over the first fin; forming source/drain regions in the first fin, the source/drain regions being adjacent the dummy gate stack; before condensing germanium at the surface of the first fin, removing the dummy gate stack; and after condensing the germanium at the surface of the first fin, forming the metal gate stack in place of the dummy gate stack. In some embodiments, the method further includes: before condensing the germanium at the surface of the first fin, forming lightly doped source/drain (LDD) regions in the first fin, upper portions of the LDD regions having a same germanium concentration as lower portions of the LDD regions. In some embodiments, the method further includes: before condensing the germanium at the surface of the first fin, forming gate spacers adjacent the metal gate stack, the gate spacers extending along a portion of the first fin that is substantially free from the germanium-rich layer. In some embodiments, the method further includes: after condensing the germanium at the surface of the first fin, growing a first protective cap on the first fin and a second protective cap on the second fin. In some embodiments of the method, forming the metal gate stack over the first fin includes: forming an opening extending through the first protective cap; and forming the metal gate stack in the opening of the first protective cap.

In an embodiment, a device includes: a first semiconductor region extending from a substrate, the first semiconductor region including silicon; a second semiconductor region on the first semiconductor region, the second semiconductor region including silicon germanium, a surface of the second semiconductor region having a first germanium concentration, a subsurface of the second semiconductor region having a second germanium concentration, the first germanium concentration being greater than the second germanium concentration; a protective cap on the second semiconductor region, the protective cap including silicon; a metal gate stack extending through the protective cap to contact the surface of the second semiconductor region; and source and drain regions in the second semiconductor region, the source and drain regions being adjacent the metal gate stack.

In some embodiments, the device further includes: a lightly doped source/drain (LDD) region in the second semiconductor region, upper portions of the LDD region having a higher germanium concentration than lower portions of the LDD region. In some embodiments, the device further includes: gate spacers extending along the protective cap, the metal gate stack being disposed between the gate spacers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first fin extending from a substrate, the substrate comprising silicon, the first fin comprising silicon germanium;
    forming an isolation region around the first fin, an oxide layer being formed on the first fin during formation of the isolation region;
    removing the oxide layer from the first fin with a hydrogen-based etching process, silicon at a surface of the first fin being terminated with hydrogen after the hydrogen-based etching process;
    desorbing the hydrogen from the silicon at the surface of the first fin to depassivate the silicon; and
    exchanging the depassivated silicon at the surface of the first fin with germanium at a subsurface of the first fin.

2. The method of claim 1, wherein desorbing the hydrogen and exchanging the silicon are performed with a thermal treatment process.

3. The method of claim 2, wherein the thermal treatment process comprises:
    placing the first fin in a hydrogen-starved environment;
    annealing the first fin until the silicon germanium of the first fin is at sorption equilibrium; and
    removing the desorbed hydrogen from the hydrogen-starved environment while the silicon germanium of the first fin is at sorption equilibrium.

4. The method of claim 3, wherein the hydrogen-starved environment includes nitrogen, helium, or argon.

5. The method of claim 3, wherein the hydrogen-starved environment is a vacuum.

6. The method of claim 3, wherein annealing the first fin comprises annealing the first fin at a temperature in a range of 250° C. to 500° C., and for a duration of less than 60 minutes.

7. The method of claim 2 further comprising:
    forming a second fin extending from the substrate, the second fin comprising silicon, wherein the second fin is exposed to the thermal treatment process, a material composition of the second fin remaining unmodified during the thermal treatment process.

8. A method comprising:
    forming a first fin and a second fin extending from a substrate, the first fin comprising silicon germanium, the second fin comprising silicon;
    forming an oxide layer on the first fin and the second fin;
    removing the oxide layer from the first fin and the second fin with a hydrogen-based etching process, a surface of the first fin and a surface of the second fin being terminated with hydrogen after the hydrogen-based etching process;
    condensing germanium at the surface of the first fin with a hydrogen desorbing process to form a germanium-rich layer at the surface of the first fin, a material composition of a subsurface of the second fin remaining unmodified during the hydrogen desorbing process; and
    forming a metal gate stack over the first fin, the metal gate stack extending along the germanium-rich layer of the first fin.

9. The method of claim 8, wherein no mask layers are formed over the second fin during the hydrogen desorbing process such that the second fin is exposed to the hydrogen desorbing process.

10. The method of claim 8 further comprising:
    after condensing the germanium at the surface of the first fin, forming a dummy gate stack over the first fin;
    forming source/drain regions in the first fin, the source/drain regions being adjacent the dummy gate stack;
    removing the dummy gate stack to expose the germanium-rich layer at the surface of the first fin; and
    forming the metal gate stack in place of the dummy gate stack.

11. The method of claim 10 further comprising:
    after condensing the germanium at the surface of the first fin, forming lightly doped source/drain (LDD) regions in the first fin, upper portions of the LDD regions having a higher germanium concentration than lower portions of the LDD regions.

12. The method of claim 10 further comprising:
after condensing the germanium at the surface of the first fin, forming gate spacers adjacent the metal gate stack, the gate spacers extending along the germanium-rich layer of the first fin.

13. The method of claim 8 further comprising:
forming a dummy gate stack over the first fin;
forming source/drain regions in the first fin, the source/drain regions being adjacent the dummy gate stack;
before condensing germanium at the surface of the first fin, removing the dummy gate stack; and
after condensing the germanium at the surface of the first fin, forming the metal gate stack in place of the dummy gate stack.

14. The method of claim 13 further comprising:
before condensing the germanium at the surface of the first fin, forming lightly doped source/drain (LDD) regions in the first fin, upper portions of the LDD regions having a same germanium concentration as lower portions of the LDD regions.

15. The method of claim 13 further comprising:
before condensing the germanium at the surface of the first fin, forming gate spacers adjacent the metal gate stack, the gate spacers extending along a portion of the first fin that is substantially free from the germanium-rich layer.

16. The method of claim 8 further comprising:
after condensing the germanium at the surface of the first fin, growing a first protective cap on the first fin and a second protective cap on the second fin.

17. The method of claim 16, wherein forming the metal gate stack over the first fin comprises:
forming an opening extending through the first protective cap; and
forming the metal gate stack in the opening of the first protective cap.

18. A method comprising:
forming an oxide layer on a first fin and a second fin, the first fin comprising silicon germanium, the second fin comprising silicon;
removing the oxide layer from the first fin and the second fin with a hydrogen-based etching process, a first surface of the first fin and a second surface of the second fin being terminated with hydrogen after the hydrogen-based etching process;
performing a germanium condensation process to desorb the hydrogen from the first surface of the first fin and the second surface of the second fin, and to condense germanium at the first surface of the first fin but not the second surface of the second fin;
after the germanium condensation process, growing a first protective cap on the first fin and a second protective cap on the second fin;
forming a first dummy gate on the first protective cap and a second dummy gate on the second protective cap;
replacing the first dummy gate and a first portion of the first protective cap with a first metal gate; and
replacing the second dummy gate and a second portion of the second protective cap with a second metal gate.

19. The method of claim 18, wherein the germanium condensation process comprises annealing the first fin and the second fin in a hydrogen-starved environment, at a temperature in a range of 250° C. to 500° C., and for a duration of less than 60 minutes.

20. The method of claim 18 further comprising:
forming first gate spacers on the first protective cap and second gate spacers on the second protective cap, the first gate spacers adjacent the first dummy gate, the second gate spacers adjacent the second dummy gate.

* * * * *